(12) United States Patent
Dadheech et al.

(10) Patent No.: US 11,245,105 B2
(45) Date of Patent: Feb. 8, 2022

(54) REFERENCE ELECTRODE ASSEMBLIES INCLUDING THIN, POROUS CURRENT COLLECTORS AND METHODS OF MANUFACTURING THIN, POROUS CURRENT COLLECTORS

(71) Applicant: GM GLOBAL TECHNOLOGY OPERATIONS LLC, Detroit, MI (US)

(72) Inventors: Gayatri V. Dadheech, Bloomfield Hills, MI (US); Brian J. Koch, Berkley, MI (US); Alfred Zhang, Troy, MI (US); Robert S. Conell, Sterling Heights, MI (US); Jing Gao, Rochester, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 89 days.

(21) Appl. No.: 16/577,921

(22) Filed: Sep. 20, 2019

(65) Prior Publication Data

US 2021/0091369 A1    Mar. 25, 2021

(51) Int. Cl.
*H01M 50/403* (2021.01)
*H01M 10/48* (2006.01)
(Continued)

(52) U.S. Cl.
CPC ....... *H01M 4/0426* (2013.01); *C23C 14/0031* (2013.01); *C23C 14/35* (2013.01);
(Continued)

(58) Field of Classification Search
None
See application file for complete search history.

(56) References Cited

U.S. PATENT DOCUMENTS 6,673,127 B1 * 1/2004 Allen ................. H01M 8/0245
29/623.1
10,020,456 B2    7/2018 Martin et al.
(Continued)

FOREIGN PATENT DOCUMENTS

CN    112542567 A    3/2021
CN    112542568 A    3/2021

OTHER PUBLICATIONS

Research Gate (Year: 2015).*
(Continued)

*Primary Examiner* — Yoshitoshi Takeuchi
(74) *Attorney, Agent, or Firm* — Harness, Dickey & Pierce, P.L.C.

(57) ABSTRACT

A method of manufacturing a component for a reference electrode assembly according to various aspects of the present disclosure includes providing a separator having first and second opposing surfaces. The method further includes sputtering a first current collector layer to the first surface via magnetron or ion beam sputtering deposition. A porosity of the separator is substantially unchanged by the sputtering. In one aspect, the method further includes sputtering a second current collector layer to the second surface via magnetron or ion beam sputtering deposition. In one aspect, the first current collector layer includes nickel and defines a first thickness of greater than or equal to about 200 nm to less than or equal to about 300 nm and the second current collector layer includes gold and defines a second thickness of greater than or equal to about 25 nm to less than or equal to about 100 nm.

20 Claims, 11 Drawing Sheets

(51) Int. Cl.

| | | |
|---|---|---|
| *C23C 14/35* | (2006.01) | |
| *C23C 14/34* | (2006.01) | |
| *C23C 14/20* | (2006.01) | |
| *C23C 14/14* | (2006.01) | |
| *G01R 19/00* | (2006.01) | |
| *G01R 31/364* | (2019.01) | |
| *H01M 4/04* | (2006.01) | |
| *H01M 4/52* | (2010.01) | |
| *H01M 10/0525* | (2010.01) | |
| *H01M 4/66* | (2006.01) | |
| *C23C 14/00* | (2006.01) | |
| *H01M 4/134* | (2010.01) | |
| *H01J 37/34* | (2006.01) | |

(52) U.S. Cl.
CPC ......... *H01J 37/3408* (2013.01); *H01M 4/134* (2013.01); *H01M 4/52* (2013.01); *H01M 4/661* (2013.01); *H01M 10/0525* (2013.01)

(56) References Cited

U.S. PATENT DOCUMENTS

| | | | |
|---|---|---|---|
| 2001/0008728 A1* | 7/2001 | Turner | H01M 4/40 |
| | | | 429/218.1 |
| 2005/0079418 A1* | 4/2005 | Kelley | C23C 14/042 |
| | | | 429/231.95 |
| 2018/0062221 A1* | 3/2018 | Koch | H01M 10/48 |
| 2018/0287139 A1 | 10/2018 | Xiao et al. | |
| 2019/0237822 A1 | 8/2019 | Rober et al. | |
| 2021/0091424 A1 | 3/2021 | Gao et al. | |
| 2021/0167383 A1 | 6/2021 | Nelson et al. | |

OTHER PUBLICATIONS

Green Car Congress (Year: 2011).*
Gao, Jing et al., U.S. Appl. No. 16/577,934, filed Sep. 20, 2019 entitled, "Thin-Film Reference Electrodes, Electrochemical Devices Including Thin-Film Reference Electrodes, and Methods of Making Thin-Film Reference Electrodes," 63 pages.

* cited by examiner

REFERENCE ELECTRODE ASSEMBLIES INCLUDING THIN, POROUS CURRENT COLLECTORS AND METHODS OF MANUFACTURING THIN, POROUS CURRENT COLLECTORS

INTRODUCTION

This section provides background information related to the present disclosure which is not necessarily prior art.

The present disclosure relates to reference electrode assemblies including thin, porous current collectors and methods of manufacturing thin, porous current collectors.

By way of background, high-energy density, electrochemical cells, such as lithium-ion batteries can be used in a variety of consumer products and vehicles, such as Hybrid Electric Vehicles (HEVs) and Electric Vehicles (EVs). Typical lithium-ion, lithium sulfur, and lithium-lithium symmetrical batteries include a first electrode, a second electrode, an electrolyte material, and a separator. One electrode serves as a positive electrode or cathode and another serves as a negative electrode or anode. A stack of battery cells may be electrically connected to increase overall output.

Rechargeable lithium-ion batteries operate by reversibly passing lithium-ions back and forth between the negative electrode and the positive electrode. A separator and an electrolyte are disposed between the negative and positive electrodes. The electrolyte is suitable for conducting lithium-ions and may be in solid (e.g., solid state diffusion) or liquid form. Lithium-ions move from a cathode (positive electrode) to an anode (negative electrode) during charging of the battery, and in the opposite direction when discharging the battery. It may be desirable to perform electrochemical analysis on batteries or certain components of batteries, such as the cathode and the anode.

SUMMARY

This section provides a general summary of the disclosure, and is not a comprehensive disclosure of its full scope or all of its features.

In various aspects, the present disclosure provides a method of manufacturing a component for a reference electrode assembly. The method includes providing a separator layer. The separator layer has a first surface and a second surface opposite the first surface. The separator layer is electrically insulating and ionically conductive. The method further includes sputtering a first current collector layer to the first surface. The sputtering includes magnetron sputtering deposition or ion beam sputtering deposition. A porosity of the separator layer is substantially unchanged by the sputtering the first current collector layer.

In one aspect, the method further includes sputtering a second current collector layer to the second surface. The sputtering includes magnetron sputtering deposition or ion beam sputtering deposition.

In one aspect, the first current collector layer includes nickel and defines. The first current collector layer defines a first thickness of greater than or equal to about 200 nm to less than or equal to about 300 nm. The second current collector layer includes gold. The second current collector layer defines a second thickness of greater than or equal to about 25 nm to less than or equal to about 100 nm.

In one aspect, the method further includes applying an electroactive layer in contact with the second current collector layer.

In one aspect, the method further includes, prior to the sputtering, applying a mask layer to a first region of the first surface. The method further includes, after the sputtering, removing the mask layer from the first surface such that the first current collector layer is disposed in a second region of the first surface distinct from the first region.

In one aspect, the mask layer includes metal, a plastic, cellulose, or a water-soluble composition.

In one aspect, the method further includes coupling the mask layer to the separator layer by a magnet, a clamp, a temporary adhesive, or any combination thereof.

In one aspect, the sputtering includes the magnetron sputtering deposition.

In one aspect, the magnetron sputtering deposition further includes cooling the separator layer concurrently with the sputtering.

In one aspect, a volumetric flow rate of a sputtering gas is greater than or equal to about 20 standard cubic centimeters per minute (sccm) to less than or equal to about 300 sccm. A voltage is greater than or equal to about 30 V to less than or equal to about 300 V. A deposition pressure is greater than or equal to about 3 millitorr (mTorr) to less than or equal to about 32 mTorr.

In one aspect, the sputtering includes the ion beam sputtering deposition.

In one aspect, a sputtering rate is greater than or equal to about 1 nm/min to less than or equal to about 200 nm/min. An ion energy is greater than or equal to about 100 eV to less than or equal to about 100 eV. An ion current density is greater than or equal to about 0.1 mA/cm$^2$ to less than or equal to about 10 mA/cm$^2$. An angle of incidence is greater than or equal to about 20° to less than or equal to about 60°.

In one aspect, the separator layer is maintained at a temperature of less than or equal to about 25° C. during the sputtering.

In one aspect, a porosity of the separator layer after the sputtering is greater than or equal to about 50%.

In various aspects, the present disclosure provides a reference electrode assembly. The reference electrode assembly includes a separator layer, a first current collector layer, a second current collector layer, and an electroactive layer. The separator layer has a first surface and a second surface opposite the first surface. The separator layer has a first porosity of greater than or equal to about 50%. The first current collector layer is disposed on the first surface. The first current collector layer includes a first electrically-conductive material. The first current collector layer defines a first thickness of greater than or equal to about 200 nm to less than or equal to about 300 nm. The first current collector layer has a second porosity of greater than or equal to about 50%. The second current collector layer is disposed on the second surface. The second current collector layer includes a second electrically-conductive material. The second current collector layer defines a second thickness of greater than or equal to about 25 nm to less than or equal to about 100 nm. The second current collector layer has a third porosity of greater than or equal to about 50%. The electroactive layer is in contact with the second current collector layer. The electroactive layer includes an electroactive material and a binder. The electroactive layer is porous.

In at least one aspect, the first electrically-conductive material includes nickel.

In at least one aspect, the first current collector layer covers substantially an entire superficial surface area of the first surface.

In at least one aspect, the second electrically-conductive material includes gold.

In at least one aspect, a first variation in the second thickness is less than or equal to about 0.5 µm. A second variation in the third thickness is less than or equal to about 0.5 µm.

In various aspects, the present disclosure provides a three-electrode electrochemical device. The three-electrode electrochemical device includes a first electrode, a second electrode, a separator component, a reference electrode assembly, and an electrolyte. The first electrode includes a first electroactive material. The second electrode includes a second electroactive material. The separator component is disposed between the first electrode and the second electrode. The separator component is electrically insulting and ionically conductive. The reference electrode assembly is disposed between the first electrode and the separator component. he reference electrode assembly includes a separator layer, a first current collector layer, a second current collector layer, and an electroactive layer. The separator layer has a first surface and a second surface opposite the first surface. The separator layer has a first porosity of greater than or equal to about 50%. The first current collector layer is disposed on the first surface. The first current collector layer includes a first electrically-conductive material. The first current collector layer defines a first thickness of greater than or equal to about 200 nm to less than or equal to about 300 nm. The first current collector layer has a second porosity of greater than or equal to about 50%. The first current collector layer is disposed between the first electrode and the separator layer. The second current collector layer is disposed on the second surface. The second current collector layer includes a second electrically-conductive material. The second current collector layer defines a second thickness of greater than or equal to about 25 nm to less than or equal to about 100 nm. The second current collector layer has a third porosity of greater than or equal to about 50. The electroactive layer includes an electroactive material and a binder. The electroactive layer is porous. The electroactive layer is disposed between the separator layer and the separator component.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a schematic view of an exemplary electrochemical cell according to various aspects of the present disclosure;

FIG. 2A-2C relate to a reference electrode assembly according to various aspects of the present disclosure; FIG. 2A is a side view of a first side of the reference electrode assembly; FIG. 2B is a side view of a second side of the reference electrode assembly; and FIG. 2C is a sectional view taken at line 2C-2C of FIG. 2B;

FIGS. 3A-3B relate to another reference electrode assembly according to various aspects of the present disclosure; FIG. 3A is a side view of a first side of the reference electrode assembly; and FIG. 3B is a side view of a second side of the reference electrode assembly;

Figure 8A:
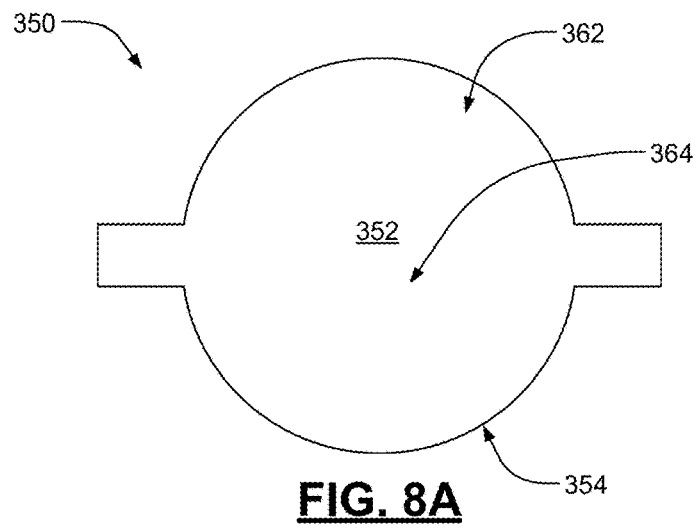
Figure 8B:
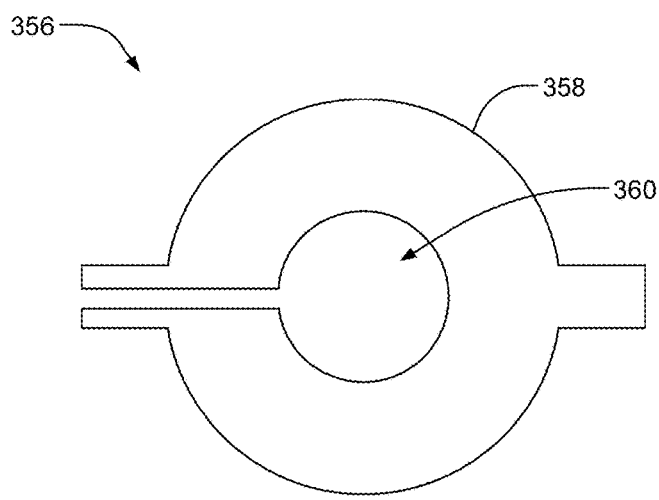
Figure 8C:
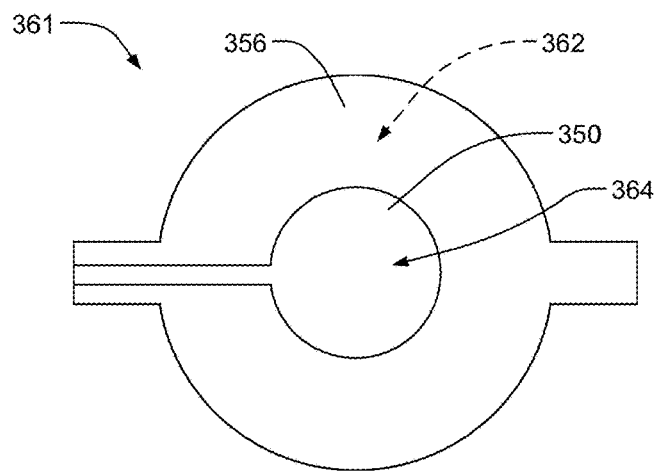
Figure 9:
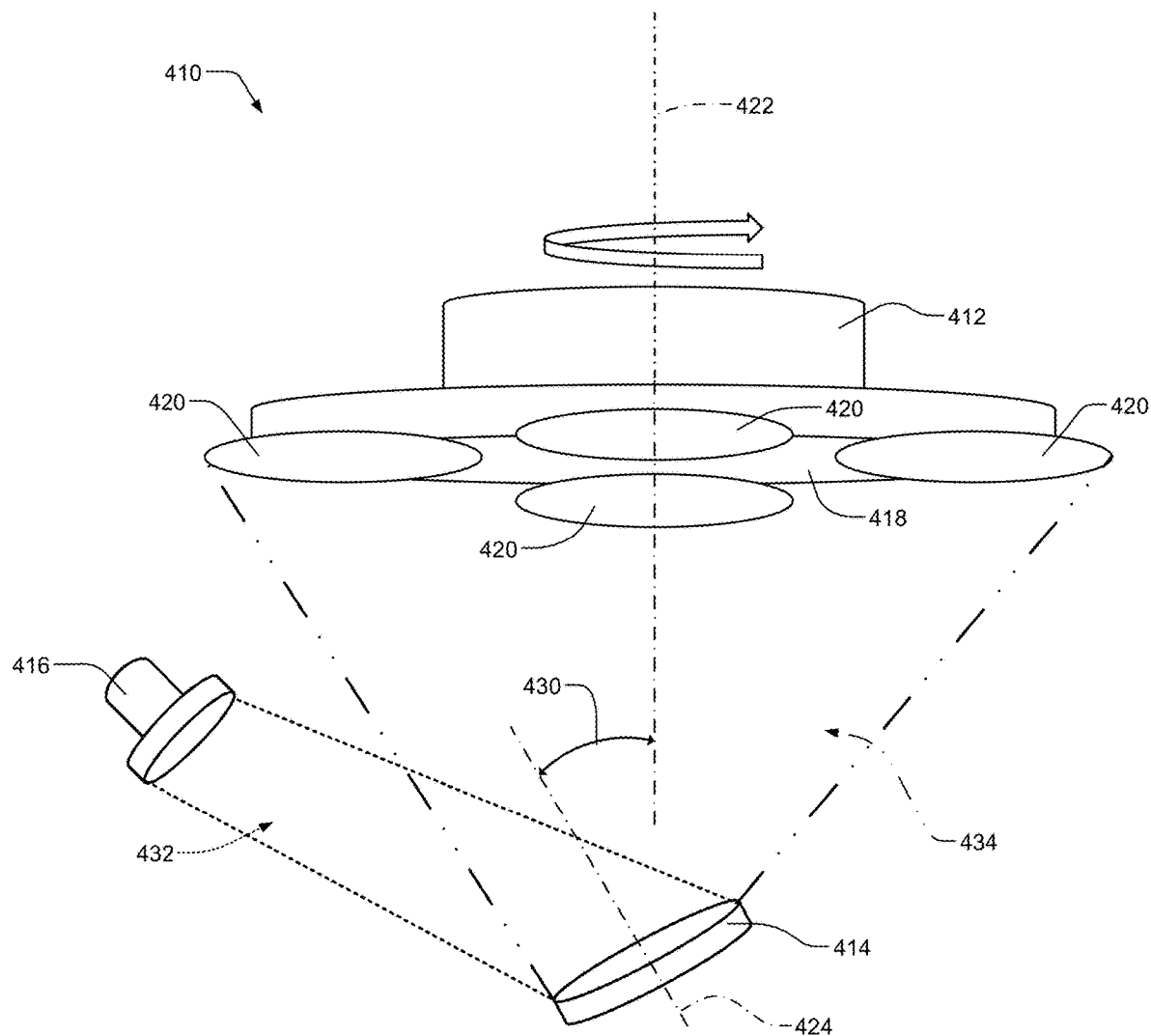
Figure 10:
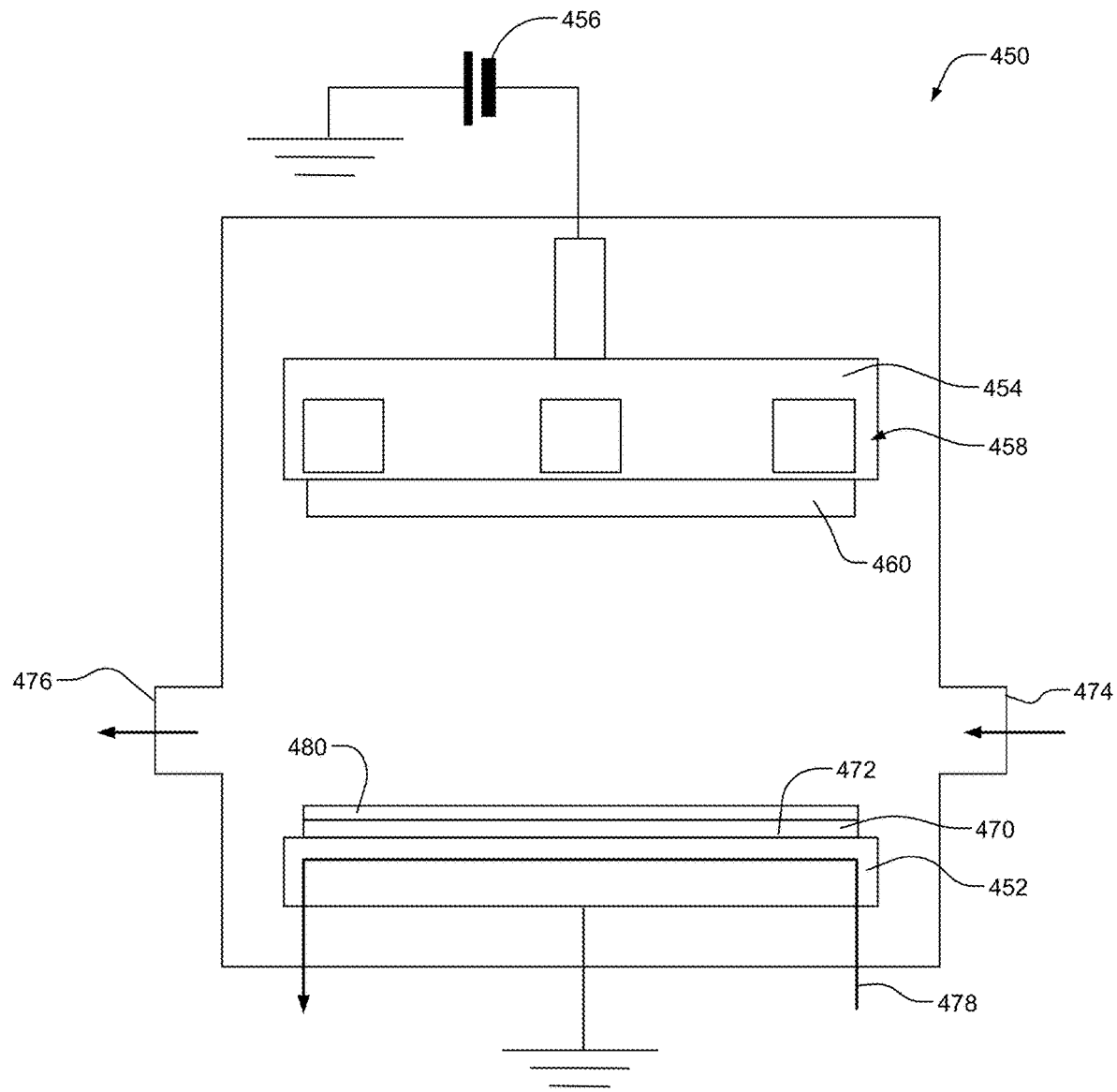
Figure 11:
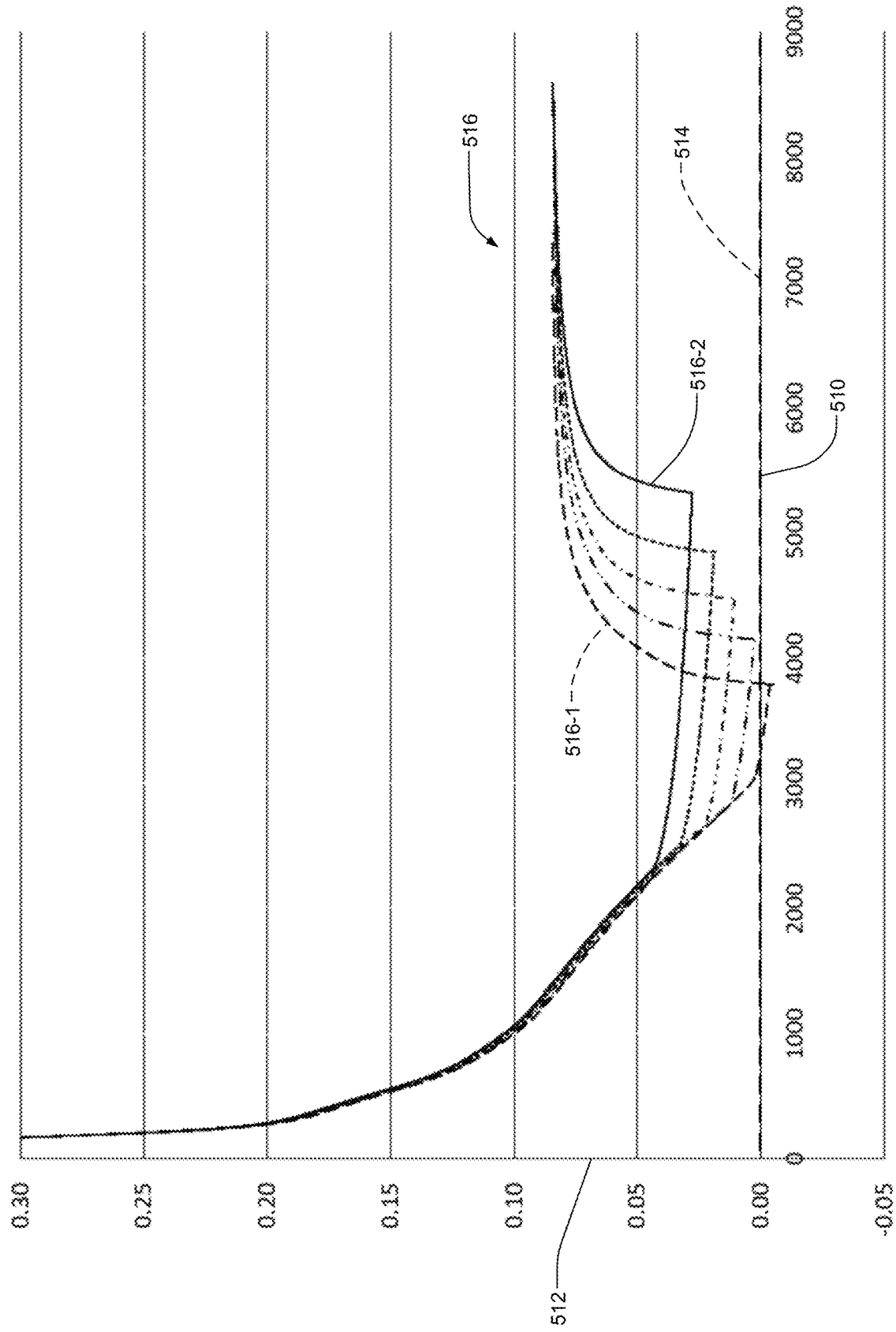
Figure 12:
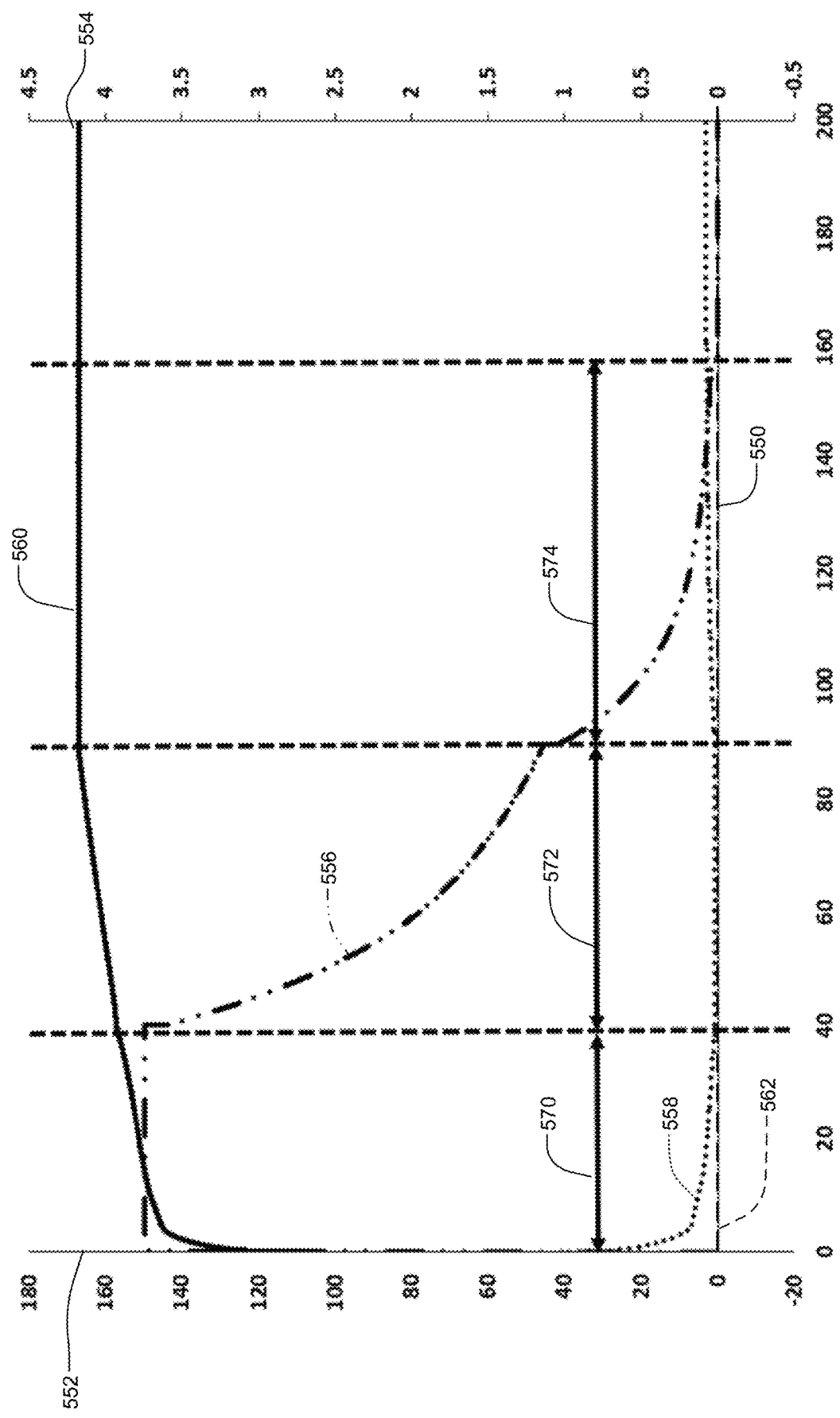

FIGS. 8A-8C relate to a method of applying a mask layer to a separator layer according to various aspects of the present disclosure; FIG. 8A is a side view of the separator layer; FIG. 8B is a side view of the mask layer; and FIG. 8C is a side view of the mask layer coupled to the separator layer;

FIG. 9 is a schematic view of a method of applying a current collector layer to a separator layer via ion beam sputtering deposition according to various aspects of the present disclosure;

FIG. 10 is a schematic view of a method of applying a current collector layer to a separator layer via magnetron sputtering deposition according to various aspects of the present disclosure;

FIG. 11 is a graph depicting voltage as a function of time according to various aspects of the present disclosure; and FIG. 12 is a graph depicting current and potential as a function of time according to various aspects of the present disclosure.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

General Electrochemical Cell Function, Structure, and Composition

A typical electrochemical cell includes a first electrode, such as a positive electrode or cathode; a second electrode such as a negative electrode or an anode; an electrolyte; and a separator. Often, in a lithium-ion battery pack, electrochemical cells are electrically connected in a stack to increase overall output. Lithium-ion electrochemical cells operate by reversibly passing lithium ions between the negative electrode and the positive electrode. The separator and the electrolyte are disposed between the negative and positive electrodes. The electrolyte is suitable for conducting lithium ions and may be in liquid, gel, or solid form. Lithium ions move from a positive electrode to a negative electrode during charging of the battery, and in the opposite direction when discharging the battery.

Each of the negative and positive electrodes within a stack is typically electrically connected to a current collector (e.g., a metal, such as copper for the negative electrode and aluminum for the positive electrode). During battery usage, the current collectors associated with the two electrodes are connected by an external circuit that allows current generated by electrons to pass between the negative and positive electrodes to compensate for transport of lithium ions.

Electrodes can generally be incorporated into various commercial battery designs, such as prismatic shaped cells, wound cylindrical cells, coin cells, pouch cells, or other suitable cell shapes. The cells can include a single electrode structure of each polarity or a stacked structure with a plurality of positive electrodes and negative electrodes assembled in parallel and/or series electrical connections. In particular, the battery can include a stack of alternating positive electrodes and negative electrodes with separators disposed therebetween. While the positive electroactive materials can be used in batteries for primary or single charge use, the resulting batteries generally have desirable cycling properties for secondary battery use over multiple cycling of the cells.

Figure 1:
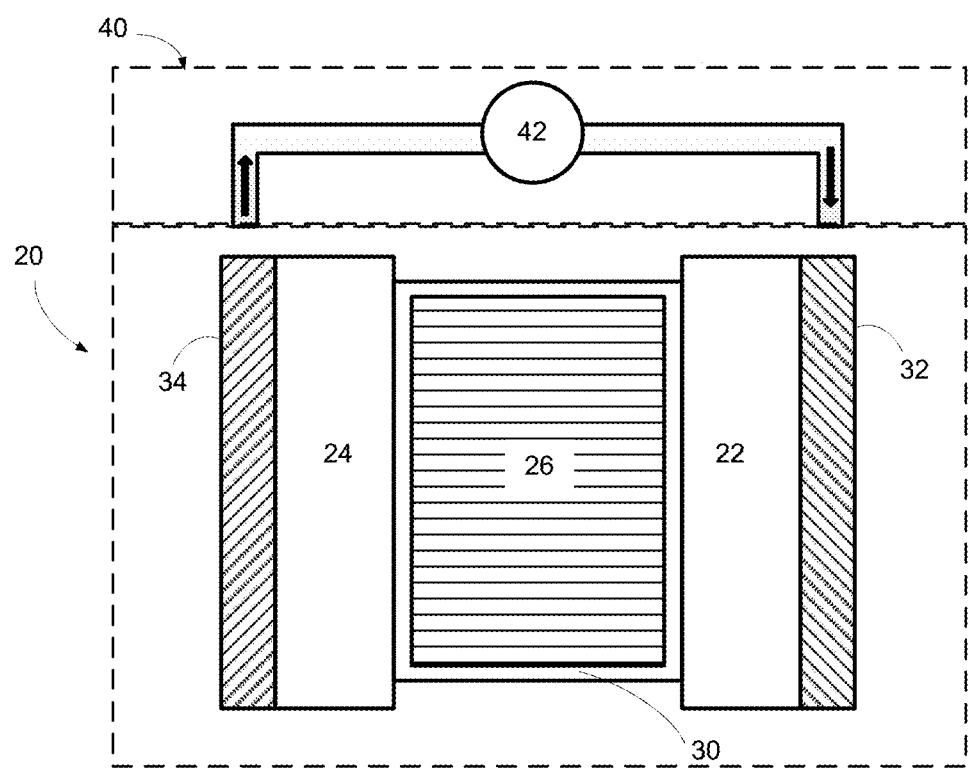

An exemplary schematic illustration of a lithium-ion battery 20 is shown in FIG. 1. The lithium-ion battery 20 includes a negative electrode 22, a positive electrode 24, and a porous separator 26 (e.g., a microporous or nanoporous polymeric separator) disposed between the negative and positive electrodes 22, 24. An electrolyte 30 is disposed between the negative and positive electrodes 22, 24 and in pores of the porous separator 26. The electrolyte 30 may also be present in the negative electrode 22 and positive electrode 24, such as in pores.

A negative electrode current collector 32 may be positioned at or near the negative electrode 22. A positive electrode current collector 34 may be positioned at or near the positive electrode 24. While not shown, the negative electrode current collector 32 and the positive electrode current collector 34 may be coated on one or both sides, as is known in the art. In certain aspects, the current collectors may be coated with an electroactive material/electrode layer on both sides. The negative electrode current collector 32 and positive electrode current collector 34 respectively collect and move free electrons to and from an external circuit 40. The interruptible external circuit 40 includes a load device 42 that connects the negative electrode 22 (through the negative electrode current collector 32) and the positive electrode 24 (through the positive electrode current collector 34).

The porous separator 26 operates as both an electrical insulator and a mechanical support. More particularly, the porous separator 26 is disposed between the negative electrode 22 and the positive electrode 24 to prevent or reduce physical contact and thus, the occurrence of a short circuit. The porous separator 26, in addition to providing a physical barrier between the two electrodes 22, 24, can provide a minimal resistance path for internal passage of lithium ions (and related anions) during cycling of the lithium ions to facilitate functioning of the lithium-ion battery 20.

The lithium-ion battery 20 can generate an electric current during discharge by way of reversible electrochemical reactions that occur when the external circuit 40 is closed (to electrically connect the negative electrode 22 and the positive electrode 24) when the negative electrode 22 contains a relatively greater quantity of cyclable lithium. The chemical potential difference between the positive electrode 24 and the negative electrode 22 drives electrons produced by the oxidation of lithium (e.g., intercalated/alloyed/plated lithium) at the negative electrode 22 through the external circuit 40 toward the positive electrode 24. Lithium ions, which are also produced at the negative electrode, are concurrently transferred through the electrolyte 30 and porous separator 26 towards the positive electrode 24. The electrons flow through the external circuit 40 and the lithium ions migrate across the porous separator 26 in the electrolyte 30 to intercalate/alloy/plate into a positive electroactive material of the positive electrode 24. The electric current passing through the external circuit 40 can be harnessed and directed through the load device 42 until the lithium in the negative electrode 22 is depleted and the capacity of the lithium-ion battery 20 is diminished.

The lithium-ion battery 20 can be charged or re-energized at any time by connecting an external power source (e.g., charging device) to the lithium-ion battery 20 to reverse the electrochemical reactions that occur during battery discharge. The connection of an external power source to the lithium-ion battery 20 compels the lithium ions at the positive electrode 24 to move back toward the negative electrode 22. The electrons, which flow back towards the negative electrode 22 through the external circuit 40, and the lithium ions, which are carried by the electrolyte 30 across the separator 26 back towards the negative electrode 22, reunite at the negative electrode 22 and replenish it with lithium for consumption during the next battery discharge cycle. As such, each discharge and charge event is considered to be a cycle, where lithium ions are cycled between the positive electrode 24 and negative electrode 22.

The external power source that may be used to charge the lithium-ion battery 20 may vary depending on the size, construction, and particular end-use of the lithium-ion battery 20. Some notable and exemplary external power sources include, but are not limited to, AC power sources, such as an AC wall outlet or a motor vehicle alternator. A converter may be used to change from AC to DC for charging the battery 20.

In many lithium-ion battery configurations, each of the negative electrode current collector 32, negative electrode 22, the separator 26, positive electrode 24, and positive electrode current collector 34 are prepared as relatively thin layers (for example, from several microns to a millimeter or less in thickness) and assembled in layers connected in electrical series and/or parallel arrangement to provide a suitable electrical energy and power package. Furthermore, the lithium-ion battery 20 can include a variety of other components that, while not depicted here, are nonetheless known to those of skill in the art. For instance, the lithium-ion battery 20 may include a casing, gaskets, terminal caps, tabs, battery terminals, and any other conventional components or materials that may be situated within the battery 20, including between or around the negative electrode 22, the positive electrode 24, and/or the separator 26, by way of non-limiting example. As noted above, the size and shape of the lithium-ion battery 20 may vary depending on the particular application for which it is designed. Battery-powered vehicles and handheld consumer electronic devices are two examples where the lithium-ion battery 20 would most likely be designed to different size, capacity, and power-output specifications. The lithium-ion battery 20 may also be connected in series or parallel with other similar lithium-ion cells or batteries to produce a greater voltage output, energy, and/or power as required by the load device 42.

Accordingly, the lithium-ion battery 20 can generate electric current to a load device 42 that can be operatively connected to the external circuit 40. While the load device 42 may be any number of known electrically-powered devices, a few specific examples of power-consuming load devices include an electric motor for a hybrid vehicle or an all-electric vehicle, a laptop computer, a tablet computer, a cellular phone, and cordless power tools or appliances, by way of non-limiting example. The load device 42 may also be a power-generating apparatus that charges the lithium-ion battery 20 for purposes of storing energy. In certain other variations, the electrochemical cell may be a supercapacitor, such as a lithium-ion based supercapacitor.

Electrolyte

Any appropriate electrolyte 30, whether in solid, liquid, or gel form, capable of conducting lithium ions between the negative electrode 22 and the positive electrode 24 may be used in the lithium-ion battery 20. In certain aspects, the electrolyte 30 may be a non-aqueous liquid electrolyte solution that includes a lithium salt dissolved in an organic solvent or a mixture of organic solvents. Numerous conventional non-aqueous liquid electrolyte 30 solutions may be employed in the lithium-ion battery 20. In certain variations, the electrolyte 30 may include an aqueous solvent (i.e., a water-based solvent) or a hybrid solvent (e.g., an organic solvent including at least 1% water by weight).

Appropriate lithium salts generally have inert anions. Non-limiting examples of lithium salts that may be dissolved in an organic solvent to form the non-aqueous liquid electrolyte solution include lithium hexafluorophosphate (LiPF$_6$); lithium perchlorate (LiClO$_4$); lithium tetrachloroaluminate (LiAlCl$_4$); lithium iodide (LiI); lithium bromide (LiBr); lithium thiocyanate (LiSCN); lithium tetrafluoroborate (LiBF$_4$); lithium difluorooxalatoborate (LiBF$_2$(C$_2$O$_4$)) (LiODFB), lithium tetraphenylborate (LiB(C$_6$H$_5$)$_4$); lithium bis-(oxalate)borate (LiB(C$_2$O$_4$)$_2$) (LiBOB); lithium tetrafluorooxalatophosphate (LiPF$_4$(C$_2$O$_4$)) (LiFOP), lithium nitrate (LiNO$_3$), lithium hexafluoroarsenate (LiAsF$_6$); lithium trifluoromethanesulfonate (LiCF$_3$SO$_3$); lithium bis (trifluoromethanesulfonimide) (LITFSI) (LiN(CF$_3$SO$_2$)$_2$); lithium fluorosulfonylimide (LiN(FSO$_2$)$_2$) (LIFSI); and combinations thereof. In certain variations, the electrolyte 30 may include a 1 M concentration of the lithium salts.

These lithium salts may be dissolved in a variety of organic solvents, such as organic ethers or organic carbonates, by way of example. Organic ethers may include dimethyl ether, glyme (glycol dimethyl ether or dimethoxyethane (DME, e.g., 1,2-dimethoxyethane)), diglyme (diethylene glycol dimethyl ether or bis(2-methoxyethyl) ether), triglyme (tri(ethylene glycol) dimethyl ether), additional chain structure ethers, such as 1-2-diethoxyethane, ethoxymethoxyethane, 1,3-dimethoxypropane (DMP), cyclic ethers, such as tetrahydrofuran, 2-methyltetrahydrofuran, and combinations thereof. In certain variations, the organic ether compound is selected from the group consisting of: tetrahydrofuran, 2-methyl tetrahydrofuran, dioxolane, dimethoxy ethane (DME), diglyme (diethylene glycol dimethyl ether), triglyme (tri(ethylene glycol) dimethyl ether), 1,3-dimethoxypropane (DMP), and combinations thereof. Carbonate-based solvents may include various alkyl carbonates, such as cyclic carbonates (e.g., ethylene carbonate, propylene carbonate, butylene carbonate) and acyclic carbonates (e.g., dimethyl carbonate, diethyl carbonate, ethyl methyl carbonate (EMC)). Ether-based solvents include cyclic ethers (e.g., tetrahydrofuran, 2-methyltetrahydrofuran, 1,3-dioxolane) and chain structure ethers (e.g., 1,2-dimethoxyethane, 1-2-diethoxyethane, ethoxymethoxyethane).

In various aspects, appropriate solvents in addition to those described above may be selected from propylene carbonate, dimethyl carbonate, diethyl carbonate, methyl ethyl carbonate, γ-butyrolactone, dimethyl sulfoxide, acetonitrile, nitromethane and mixtures thereof.

Where the electrolyte is a solid state electrolyte, it may include a composition selected from the group consisting of: LiTi$_2$(PO$_4$)$_3$, LiGe$_2$(PO$_4$)$_3$, Li$_7$La$_3$Zr$_2$O$_{12}$, Li$_3$xLa$_{2/3}$-xTiO$_3$, Li$_3$PO$_4$, Li$_3$N, Li$_4$GeS$_4$, Li$_{10}$GeP$_2$S$_{12}$, Li$_2$S—P$_2$S$_5$, Li$_6$PS$_5$Cl, Li$_6$PS$_5$Br, Li$_6$PS$_5$I, Li$_3$OCl, Li$_{2.99}$Ba$_{0.005}$ClO, or any combination thereof.

Porous Separator

The porous separator 26 may include, in certain variations, a microporous polymeric separator including a polyolefin, including those made from a homopolymer (derived from a single monomer constituent) or a heteropolymer (derived from more than one monomer constituent), which may be either linear or branched. In certain aspects, the polyolefin may be polyethylene (PE), polypropylene (PP), or a blend of PE and PP, or multi-layered structured porous films of PE and/or PP. Commercially available polyolefin porous separator 26 membranes include CELGARD® 2500 (a monolayer polypropylene separator) and CELGARD® 2340 (a trilayer polypropylene/polyethylene/polypropylene separator) available from Celgard LLC.

When the porous separator 26 is a microporous polymeric separator, it may be a single layer or a multi-layer laminate. For example, in one embodiment, a single layer of the polyolefin may form the entire microporous polymer separator 26. In other aspects, the separator 26 may be a fibrous membrane having an abundance of pores extending between the opposing surfaces and may have a thickness of less than a millimeter, for example. As another example, however, multiple discrete layers of similar or dissimilar polyolefins may be assembled to form the microporous polymer separator 26. The microporous polymer separator 26 may also include other polymers alternatively or in addition to the polyolefin such as, but not limited to, polyethylene terephthalate (PET), polyvinylidene fluoride (PVdF), polyamide (nylons), polyurethanes, polycarbonates, polyesters, polyetheretherketones (PEEK), polyethersulfones (PES), polyimides (PI), polyamide-imides, polyethers, polyoxymethylene (e.g., acetal), polybutylene terephthalate, polyethylenenaphthenate, polybutene, polymethylpentene, polyolefin copolymers, acrylonitrile-butadiene styrene copolymers (ABS), polystyrene copolymers, polymethylmethacrylate (PMMA), polysiloxane polymers (e.g., polydimethylsiloxane (PDMS)), polybenzimidazole (PBI), polybenzoxazole (PBO), polyphenylenes, polyarylene ether ketones, polyperfluorocyclobutanes, polyvinylidene fluoride copolymers (e.g., PVdF-hexafluoropropylene or (PVdF-HFP)), and polyvinylidene fluoride terpolymers, polyvinylfluoride, liquid crystalline polymers (e.g., VECTRAN™ (Hoechst AG, Germany) and ZENITE® (DuPont, Wilmington, Del.)), polyaramides, polyphenylene oxide, cellulosic materials, meso-porous silica, or a combination thereof.

Furthermore, the porous separator 26 may be mixed with a ceramic material or its surface may be coated in a ceramic material. For example, a ceramic coating may include alumina (Al$_2$O$_3$), silicon dioxide (SiO$_2$), or combinations thereof. Various conventionally available polymers and commercial products for forming the separator 26 are contemplated, as well as the many manufacturing methods that may be employed to produce such a microporous polymer separator 26.

Solid-State Electrolyte

In various aspects, the porous separator 26 and the electrolyte 30 may be replaced with a solid state electrolyte (SSE) that functions as both an electrolyte and a separator. The SSE may be disposed between a positive electrode and a negative electrode. The SSE facilitates transfer of lithium ions, while mechanically separating and providing electrical insulation between the negative and positive electrodes 22, 24. By way of non-limiting example, SSEs may include LiTi$_2$(PO$_4$)$_3$, Li$_{1.3}$Al$_{0.3}$Ti$_{1.7}$(PO$_4$)$_3$ (LATP), LiGe$_2$(PO$_4$)$_3$, Li$_7$La$_3$Zr$_2$O$_{12}$, Li$_3$xLa$_{2/3}$-xTiO$_3$, Li$_3$PO$_4$, Li$_3$N, Li$_4$GeS$_4$, Li$_{10}$GeP$_2$S$_{12}$, Li$_2$S—P$_2$S$_5$, Li$_6$PS$_5$Cl, Li$_6$PS$_5$Br, Li$_6$PS$_5$I, Li$_3$OCl, L$_{2.99}$Ba$_{0.005}$ClO, or combinations thereof.

Positive Electrode

The positive electrode 24 may be formed from or include a lithium-based active material that can undergo lithium intercalation and deintercalation, alloying and dealloying, or plating and stripping, while functioning as the positive terminal of the lithium-ion battery 20. The positive electrode 24 may include a positive electroactive material. Positive electroactive materials may include one or more transition metal cations, such as manganese (Mn), nickel (Ni), cobalt (Co), chromium (Cr), iron (Fe), vanadium (V), and combinations thereof. However, in certain variations, the positive electrode 24 is substantially free of select metal cations, such as nickel (Ni) and cobalt (Co).

Two exemplary common classes of known electroactive materials that can be used to form the positive electrode 24 are lithium transition metal oxides with layered structures and lithium transition metal oxides with spinel phase. For example, in certain instances, the positive electrode 24 may include a spinel-type transition metal oxide, like lithium manganese oxide ($Li_{(1+x)}Mn_{(2-x)}O_4$), where x is typically <0.15, including $LiMn_2O_4$ (LMO) and lithium manganese nickel oxide $LiMn_{1.5}Ni_{0.5}O_4$ (LMNO). In other instances, the positive electrode 24 may include layered materials like lithium cobalt oxide ($LiCoO_2$), lithium nickel oxide ($LiNiO_2$), a lithium nickel manganese cobalt oxide ($Li(Ni_xMn_yCo_z)O_2$), where $0 \leq x \leq 1$, $0 \leq y \leq 1$, $0 \leq z \leq 1$, and $x+y+z=1$ (e.g., $LiNi_{0.6}Mn_{0.2}Co_{0.2}O_2$, $LiNi_{0.8}Mn_{0.1}Co_{0.1}O_2$, and/or $LiMn_{0.33}Ni_{0.33}Co_{0.33}O_2$), a lithium nickel cobalt metal oxide ($LiNi_{(1-x-y)}Co_xM_yO_2$), where $0<x<1$, $0<y<1$ and M may be Al, Mn, or the like. Other known lithium-transition metal compounds such as lithium iron phosphate ($LiFePO_4$) or lithium iron fluorophosphate ($Li_2FePO_4F$) can also be used. In certain aspects, the positive electrode 24 may include an electroactive material that includes manganese, such as lithium manganese oxide ($Li_{(1+x)}Mn_{(2-x)}O_4$), a mixed lithium manganese nickel oxide ($LiMn_{(2-x)}Ni_xO_4$), where $0 \leq x \leq 1$, and/or a lithium manganese nickel cobalt oxide (e.g., $LiNi_{0.6}Mn_{0.2}Co_{0.2}O_2$, $LiNi_{0.8}Mn_{0.1}Co_{0.1}O_2$, and/or $LiMn_{0.33}Ni_{0.33}Co_{0.33}O_2$). In a lithium-sulfur battery, positive electrodes may have elemental sulfur as the active material or a sulfur-containing active material.

The positive electroactive materials may be powder compositions. The positive electroactive materials may be intermingled with an optional electrically conductive material (e.g., electrically-conductive particles) and a polymeric binder. The binder may both hold together the positive electroactive material and provide ionic conductivity to the positive electrode 24. The polymeric binder may include polyvinylidene fluoride (PVdF), poly(vinylidene chloride) (PVC), poly((dichloro-1,4-phenylene)ethylene), carboxymethoxyl cellulose (CMC), nitrile butadiene rubber (NBR), fluorinated urethanes, fluorinated epoxies, fluorinated acrylics, copolymers of halogenated hydrocarbon polymers, epoxides, ethylene propylene diamine termonomer rubber (EPDM), hexafluoropropylene (HFP), ethylene acrylic acid copolymer (EAA), ethylene vinyl acetate copolymer (EVA), EAA/EVA copolymers, PVDF/HFP copolymers, polyvinylidene difluoride (PVdF), lithium polyacrylate (LiPAA), sodium polyacrylate (NaPAA), sodium alginate, lithium alginate, or a combination thereof.

The positive electroactive material loading in the binder can be large, such as greater than about 80% by weight. For example, the binder can be present at a level of greater than or equal to about 1% by weight to less than or equal to about 20% by weight, optionally greater than or equal to about 1% by weight to less than or equal to about 10% by weight, optionally greater than or equal to about 1% to less than or equal to about 8% by weight, optionally greater than or equal to about 1% by weight to less than or equal to about 6% by weight, optionally greater than or equal to about 1% by weight to less than or equal to about 7% by weight, optionally greater than or equal to about 1% by weight to less than or equal to about 5% by weight, or optionally greater than or equal to about 1% by weight to less than or equal to about 3% by weight.

Electrically conductive materials may include graphite, other carbon-based materials, conductive metals, or conductive polymer particles. Carbon-based materials may include, by way of non-limiting example, particles of KETCHEN™ black, DENKA™ black, acetylene black, carbon black, and the like. Conductive metal particles may include nickel, gold, silver, copper, aluminum, and the like. Examples of a conductive polymer include polyaniline, polythiophene, polyacetylene, polypyrrole, and the like. In certain aspects, mixtures of electrically conductive materials may be used.

In certain variations, the positive electrode 24 includes the electrically-conductive material in an amount less than or equal to about 15% by weight, optionally less than or equal to about 10% by weight, or optionally greater than or equal to about 0.5% by weight to less than or equal to about 8% by weight. While the supplemental electrically conductive compositions may be described as powders, these materials lose their powder character following incorporation into the electrode where the associated particles of the supplemental electrically conductive material become a component of the resulting electrode structure.

Negative Electrode

The negative electrode 22 may include a negative electroactive material as a lithium host material capable of functioning as a negative terminal of the lithium-ion battery 20. Common negative electroactive materials include lithium insertion materials or alloy host materials. Such materials can include carbon-based materials, such as lithium-graphite intercalation compounds, lithium-silicon compounds, lithium-tin alloys, or lithium titanate $Li_{4+x}Ti_5O_{12}$, where $0 \leq x \leq 3$, such as $Li_4Ti_5O_{12}$ (LTO).

In certain aspects, the negative electrode 22 may include lithium, and in certain variations metallic lithium and the lithium-ion battery 20. The negative electrode 22 may be a lithium metal electrode (LME). The lithium-ion battery 20 may be a lithium-metal battery or cell. Metallic lithium for use in the negative electrode of a rechargeable battery has various potential advantages, including having the highest theoretical capacity and lowest electrochemical potential. Thus, batteries incorporating lithium-metal anodes can have a higher energy density that can potentially double storage capacity, so that the battery may be half the size, but still last the same amount of time as other lithium-ion batteries.

In certain variations, the negative electrode 22 may optionally include an electrically conductive material, as well as one or more polymeric binder materials to structurally hold the lithium material together. For example, in one embodiment, the negative electrode 22 may include an active material including lithium-metal particles intermingled with a binder material selected from the group consisting of: polyvinylidene difluoride (PVdF), ethylene propylene diene monomer (EPDM) rubber, carboxymethoxyl cellulose (CMC), a nitrile butadiene rubber (NBR), lithium polyacrylate (LiPAA), sodium polyacrylate (NaPAA), sodium alginate, lithium alginate, or a combination thereof. Suitable additional electrically conductive materials may include carbon-based material or a conductive polymer. Carbon-based materials may include by way of example, particles of KETCHEN™ black, DENKA™ black, acetylene black, carbon black, and the like. Examples of a conductive polymer include polyaniline, polythiophene, polyacetylene, polypyrrole, and the like. In certain aspects, mixtures of conductive materials may be used. The negative electrode 22 may include about 50-100% by weight of an electroactive material (e.g., lithium particles or a lithium foil), optionally greater than or equal to about 30% by weight of an electrically conductive material, and a balance binder.

Electrode Fabrication

In various aspects, the negative and positive electrodes 22, 24 may be fabricated by mixing the respective electroactive material into a slurry with a polymeric binder compound, a non-aqueous solvent, optionally a plasticizer, and optionally if necessary, electrically conductive particles. The slurry can be mixed or agitated, and then thinly applied to a substrate via a doctor blade and/or slot die coating. The substrate can be a removable substrate or alternatively a functional substrate, such as a current collector (such as a metallic grid or mesh layer) attached to one side of the electrode film. In one variation, heat or radiation can be applied to evaporate the solvent from the electrode film, leaving a solid residue. The electrode film may be further consolidated, where heat and pressure are applied to the film to sinter and calender it. In other variations, the film may be dried at moderate temperature to form self-supporting films. If the substrate is removable, then it is removed from the electrode film that is then further laminated to a current collector. With either type of substrate, the remaining plasticizer may be extracted prior to incorporation into the battery cell. In various aspects, a solid electrode may be formed according to alternative fabrication methods.

Optional Electrode Surface Coatings

In certain variations, pre-fabricated negative electrodes 22 and positive electrodes 24 formed via the active material slurry casting described above can be directly coated via a vapor coating formation process to form a conformal inorganic-organic composite surface coating, as described further below. Thus, one or more exposed regions of the pre-fabricated negative electrodes including the electroactive material can be coated to minimize or prevent reaction of the electrode materials with components within the electrochemical cell to minimize or prevent lithium metal dendrite formation on the surfaces of negative electrode materials when incorporated into the electrochemical cell. In other variations, a plurality of particles including an electroactive material, like lithium metal, can be coated with an inorganic-organic composite surface coating. Then, the coated electroactive particles can be used in the active material slurry to form the negative electrode, as described above.

Current Collectors

The negative and positive electrodes 22, 24 are generally associated with the respective negative and positive electrode current collectors 32, 34 to facilitate the flow of electrons between the electrode and the external circuit 40. The current collectors 32, 34 are electrically conductive and can include metal, such as a metal foil, a metal grid or screen, or expanded metal. Expanded metal current collectors refer to metal grids with a greater thickness such that a greater amount of electrode material is placed within the metal grid. By way of non-limiting example, electrically-conductive materials include copper, nickel, aluminum, stainless steel, titanium, gold, alloys thereof, or combinations thereof.

The positive electrode current collector 34 may be formed from aluminum or any other appropriate electrically conductive material known to those of skill in the art. The negative electrode current collector 32 may be formed from copper or any other appropriate electrically conductive material known to those of skill in the art. Negative electrode current collectors do not typically include aluminum because aluminum reacts with lithium, thereby causing large volume expansion and contraction. The drastic volume changes may lead to fracture and/or pulverization of the current collector.

Analysis of Electrochemical Cells

It may be desirable to perform electrochemical analysis on electrodes. Electrochemical analysis may produce calibrations for control systems in HEVs and EVs pertaining to fast charge, lithium plating, state of charge, and power estimation, for example. The electrodes may be analyzed by providing a reference electrode in an electrochemical cell including positive and negative electrodes. The reference electrode enables monitoring of individual positive and negative electrode potentials as the cell is being cycled. Potentials may be monitored in a lab setting or during real-time use of a system including the electrochemical cell. For example, potentials may be detected during operation of a vehicle, as part of regular vehicle diagnostics. Detected potentials can be used in vehicle control algorithms to improve cell performance, such as by raising anode potential to decrease lithium plating.

In various aspects, the present disclosure provides reference electrode assemblies having thin-porous current collectors and three-electrode cells including reference electrode assemblies. The reference electrode assembly generally includes a separator layer, a first current collector layer disposed on a first surface of the separator layer, a second current collector layer disposed on a second surface of the separator layer, and a reference electrode disposed on the second current collector layer. The separator layer, both current collector layers, and the reference electrode layer are all porous such that ions can pass through during cycling of an electrochemical cell including the reference electrode assembly. Therefore, the reference electrode assembly does not interfere with operation of the electrochemical cell. Accordingly, the porous reference electrode assembly facilitates substantially uniform current distribution.

In certain aspects, when the reference electrode assembly is assembled in a three-electrode electrochemical cell, the first current collector layer may be in communication with a front side of a negative electrode. A negative electrode current collector may be in communication with a back side of the negative electrode current collector. Because the characteristics of the reference electrode are known, voltage measurements between the reference electrode and the front and back sides of the negative electrode may provide precise measurements of individual negative electrode health, such as potential and state of charge. Such detection can be used for in-lab validation and/or calibration of the electrochemical cell or during normal use of the electrochemical cell. For example, the three-electrode cell can be used in a vehicle. Data acquired via the reference electrode assembly can be used in vehicle algorithms to improve performance of the electrochemical cell. For example, lithium plating can be detected, and subsequently minimized or prevented. In certain aspects, vehicle algorithms may establish fastest possible recharge without lithium plating.

In various aspects, the present disclosure provides methods of manufacturing reference electrode assemblies and three-electrode cells including reference electrode assemblies. The methods may include applying two current collector layers to a separator layer by sputtering, such as ion beam sputter deposition or magnetron sputter deposition. The methods may avoid heating a separator layer above its melting point in order to maintain porosity of the separator layer. Furthermore, the sputtering methods may yield desired porosity, substantially uniform coating thickness, and low roughness. In certain aspects, regions of the separator may be covered with a mask layer during sputtering to avoid deposition of the current collector layer directly on the separator in the regions. The mask layer may thermally-dissipate heat, facilitating a reduction in hot spots on the separator layer to reduce or prevent melting and reduction or loss of porosity of the separator layer.

Figure 2A:
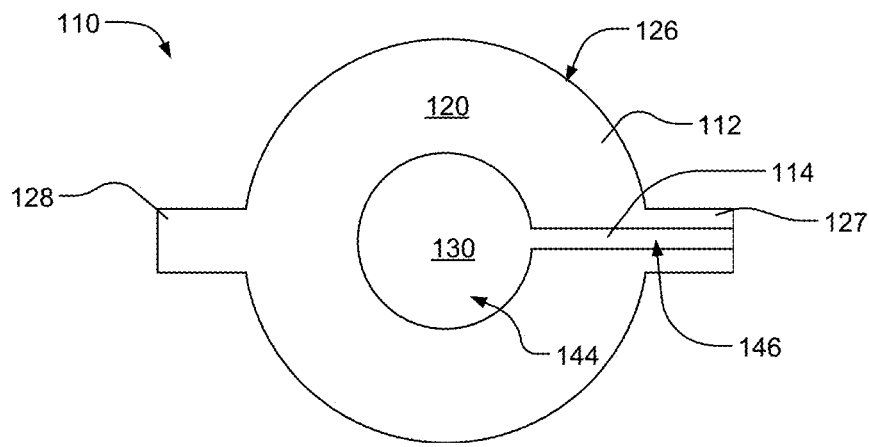
Figure 2B:
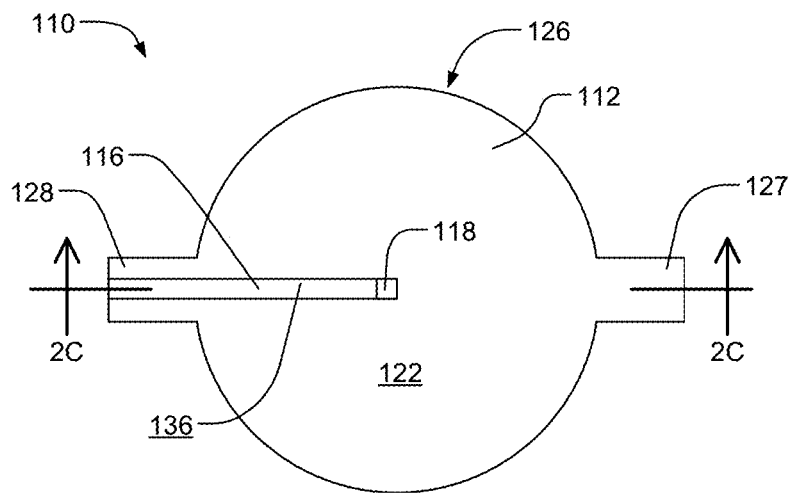
Figure 2C:
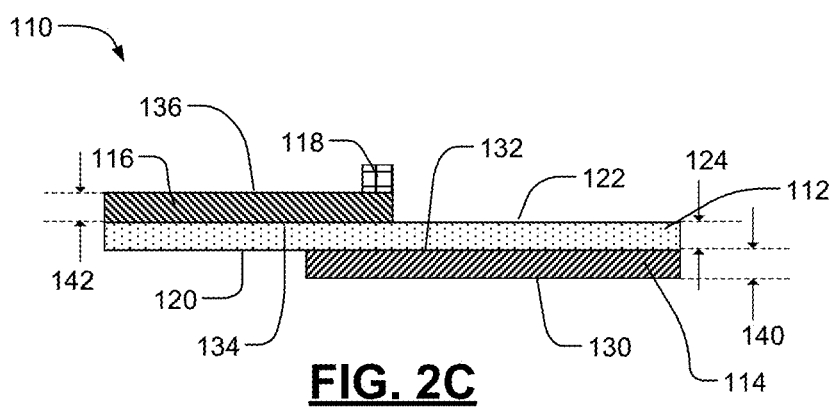

With reference to FIGS. 2A-2C, a reference electrode assembly 110 according to various aspects of the present disclosure is provided. The reference electrode assembly 110 generally includes a separator layer 112, a first current collector layer 114, a second current collector layer 116, and an electroactive layer or reference electrode 118. The separator layer 112 includes a first surface 120 and a second surface 122 opposite the first surface 120. The first current collector layer 114 is disposed on the first surface 120. The second current collector layer 116 is disposed on the second surface 122. The reference electrode 118 is disposed in electrical contact with the second surface 122.

The separator layer 112 may be electrically insulating and ionically conductive. The separator layer 112 may be similar to the porous separator 26 of FIG. 1. The separator layer 112 may define a first thickness 124. In certain aspects, the first thickness 124 may be greater than or equal to about 12 µm to less than or equal to about 50 µm, optionally greater than or equal to about 15 µm to less than or equal to about 25 µm, or optionally about 18 µm.

In certain aspects, the separator layer 112 may include a ceramic coating. The ceramic coating may be present on the first surface 120, the second surface 122, or both the first and second surfaces 120, 122. The ceramic coating may include silica ($SiO_2$), alumina ($Al_2O_3$), or both silica and alumina, by way of example. The ceramic coating may provide thermal stability, particularly during preparation of the reference electrode assembly 110 (e.g., application of the first and second current collector layers 114, 116) and mechanical support.

The separator layer 112 is porous such that ions may pass therethrough during cycling of a three-electrode electrochemical cell including the reference electrode assembly 110. In certain aspects, the separator layer 112 may have a greater porosity than that of the separator layer 26 of FIG. 1. In certain aspects, a first porosity of the separator layer 112 may be greater than or equal to about 40%, optionally greater than or equal to about 50%, optionally greater than or equal to about 60%, or optionally greater than or equal to about 70%. In certain aspects, the first porosity may be less than or equal to about 80%. For example, the first porosity may be greater than or equal to about 50% to less than or equal to about 80%, optionally greater than or equal to about 60% to less than or equal to about 80%, or optionally greater than or equal to about 70% to less than or equal to about 80%.

In certain aspects, the separator layer 112 includes a body portion 126, a first tab 127, and a second tab 128. The body portion 126 may be substantially circular. The first and second tabs 127, 128 may be diametrically opposed. However, the separator layer 112 may define other shapes and sizes, depending on the type of electrochemical cell in which it will be disposed (e.g., a coin cell or a pouch cell).

The first and second current collector layers 114, 116 may be formed from first and second electrically-conductive materials, respectively. In certain aspects, the first and second electrically-conductive materials may be independently selected from the group consisting of: copper, nickel, aluminum, stainless steel, titanium, gold, conductive carbon-based materials, alloys thereof, and combinations thereof. In certain aspects, the first current collector layer 114 is configured to be in electrical communication with a negative electrode and includes nickel. Nickel is corrosion resistant, has a relatively high electrical conductivity compared to other materials, and is relatively hard compared to other materials. The increased hardness due to the use of nickel in the first current collector layer 114 may result in the reference electrode assembly 110 having a relatively high strength. In certain aspects, the second current collector layer 116 is in electrical communication with the reference electrode 118 and includes gold.

The first and second current collector layers 114, 116 may be porous such that ions can pass therethrough during cycling of an electrochemical cell including the reference electrode assembly 110. The first and second current collector layers 114, 116 may each have a second porosity. The second porosity of the first and second current collector layers 114, 116 may be greater than or equal to about 40%, optionally greater than or equal to about 50%, optionally greater than or equal to about 60%, or optionally greater than or equal to about 70%. In certain aspects, the second porosity may be less than or equal to about 80%. For example, the second porosity may be greater than or equal to about 50% to less than or equal to about 80%, optionally greater than or equal to about 60% to less than or equal to about 80%, or optionally greater than or equal to about 70% to less than or equal to about 80%.

The first current collector layer 114 may have a third surface 130 and a fourth surface 132 opposite the third surface 130. The fourth surface 132 may be in direct contact with the first surface 120 of the separator layer 112. The second current collector layer 116 may have a fifth surface 134 and a sixth surface 136 opposite the fifth surface 134. The fifth surface 134 may be in direct contact with the second surface 122 of the separator layer 112, as shown. In various alternative aspects, the a reference electrode may be disposed between a fifth surface of a second current collector layer and a second surface of a separator layer such that the fifth surface is in indirect contact with the second surface. In certain aspects, the third and sixth surfaces 130, 136 of the first and second current collector layers 114, 116, respectively, may have a relatively low roughness.

The first current collector layer 114 may define a second thickness 140. The second current collector layer 116 may define a third thickness 142. The second and third thicknesses 140, 142 may generally be greater than or equal to about 25 nm to less than or equal to about 300 nm. In certain aspects, second and third thicknesses 140, 142 may be substantially uniform. For example, a variation in second thicknesses 140 and a variation in the third thickness 142 may each be less than or equal to about 0.5 µm.

In certain aspects, the second and third thicknesses 140, 142 may depend, as least in part, on the first and second electrically-conductive materials, respectively. For example, current collector layers formed from certain materials that are prone to oxidation (e.g., nickel) may benefit from being relatively thicker than layers including materials that are less prone to oxidation (e.g., gold). In certain aspects, the first current collector layer 114 includes nickel and the second thickness 140 is greater than or equal to about 200 nm to less than or equal to about 300 nm, optionally greater than or equal to about 225 nm to less than or equal to about 275 nm, optionally greater than or equal to about 240 nm to less than or equal to about 260 nm, or optionally about 250 nm. In certain aspects, the second current collector layer 116 includes gold and the third thickness 142 is greater than or equal to about 25 nm to less than or equal to about 100 nm, optionally greater than or equal to about 40 nm to less than or equal to about 60 nm, or optionally about 50 nm.

In certain aspects, the first and second current collector layers 114, 116 may be non-coextensive. During manufacturing, the formation of non-coextensive current collector layers, such as by sputtering, may reduce or eliminate overheating of the separator layer 112. Therefore, non-coextensive first and second current collector layers 114, 116 may facilitate maintaining an initial porosity of the separator layer 112.

In various aspects, the first current collector layer 114 includes a primary portion 144 and a tab portion 146. The primary portion 144 may be substantially circular and disposed at or near a center of the separator layer 112. In alternative aspects, the primary portion 144 defines other shapes, such as a rectangle or ellipse. The tab portion 146 may generally be line-shaped and extend from the primary portion 144 to the first tab 127 of the separator layer 112. In certain aspects, the first current collector layer 114 may occupy greater than or equal to about 30% of an area of the first surface 120, optionally greater than or equal to about 40% of an area of the first surface 120, optionally greater than or equal to about 50% of an area of the first surface 120, optionally greater than or equal to about 60% of an area of the first surface 120, optionally greater than or equal to about 70% of an area of the first surface 120, optionally greater than or equal to about 80% of an area of the first surface 120, optionally greater than or equal to about 90% of an area of the first surface 120, or optionally greater than or equal to about 95% of an area of the first surface 120. In certain aspects, the primary portion 144 may occupy substantially an entire superficial surface are of the first surface 120.

A portion of the second current collector layer 116 may extend onto the second tab 128 of the separator layer 112. In certain aspects, the second current collector layer 116 may be substantially line-shaped. However, the second current collector layer 116 may define different or additional shapes. For example, the second current collector layer 116 may define a plurality of lines, a larger area (similar to the first current collector layer 114), a grid, or a zig-zag pattern, by way of example. In certain aspects, the second current collector layer 116 may define a high aspect ratio or include high-aspect ratio features. An aspect ratio of the second current collector layer may be greater than or equal to about 4, optionally greater than or equal to about 5, optionally greater than or equal to about 6, optionally greater than or equal to about 7, optionally greater than or equal to about 8, optionally greater than or equal to about 9, or optionally greater than or equal to about 10.

The reference electrode 118 may be porous such that ions may pass therethrough during cycling of an electrochemical cell including the reference electrode assembly 110. In certain aspects, a third porosity of the reference electrode 118 may be greater than or equal to about 40%, optionally greater than or equal to about 50%, optionally greater than or equal to about 60%, or optionally greater than or equal to about 70%. In certain aspects, the third porosity may be less than or equal to about 80%. For example, the third porosity may be greater than or equal to about 40% to less than or equal to about 80%, optionally greater than or equal to about 40% to less than or equal to about 70%, or optionally greater than or equal to about 40% to less than or equal to about 60%.

The reference electrode 118 may be in direct contact with the fifth surface 134 of the second current collector layer 116, as shown. In various alternative aspects, the reference electrode 118 may be disposed between the second surface 122 of the separator layer 112 and the sixth surface 136 of the second current collector layer 116. The reference electrode 118 may be relatively small compared to the separator layer 112 and may be referred to as a "dot-like" reference electrode. In certain aspects, the reference electrode 118 may be disposed at a center of the separator layer 112.

The reference electrode 118 may include a plurality of electroactive material particles, a binder, and optionally, a conductive additive. The electroactive material may include a material having a constant or substantially constant voltage regardless of state of charge. In certain aspects, the electroactive material may include iron phosphate, lithium titanate, lithium aluminum, a metal oxide, or combinations thereof, by way of non-limiting example. The binder and the conductive additive may be formed from materials such as those described above in conjunction with the negative and positive electrodes 22, 24 of FIG. 1. In certain aspects, the binder may be a water-soluble binder.

Figure 3A:
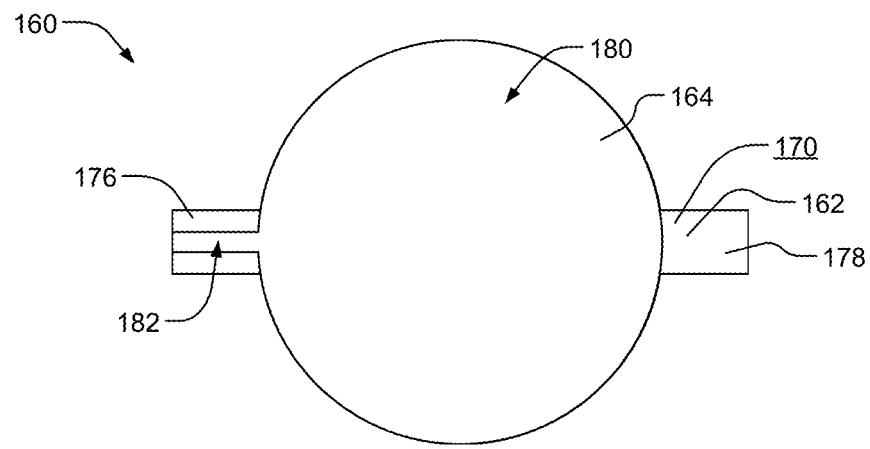
Figure 3B:
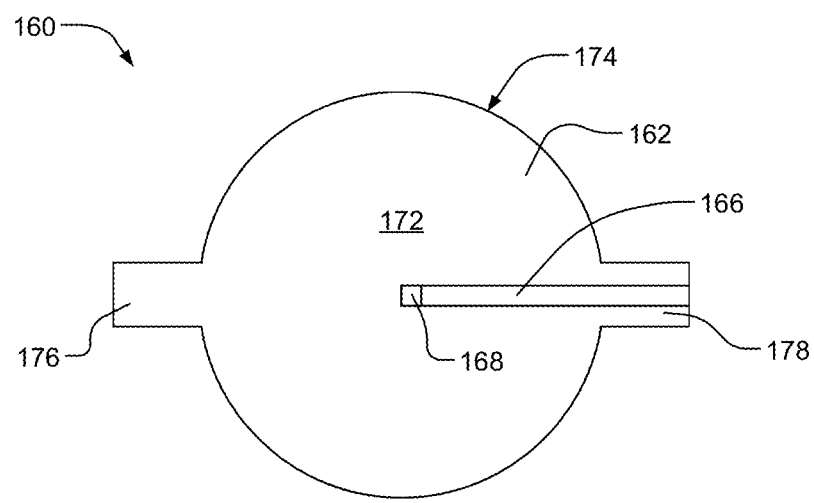

Current collector layers on reference electrode assemblies in accordance with the present disclosure may have a variety of shapes and sizes. With reference to FIGS. 3A-3B, another reference electrode assembly 160 according to various aspects of the present disclosure is provided. The reference electrode assembly 160 generally includes a separator layer 162, a first current collector layer 164, a second current collector layer 166, and an electroactive layer or reference electrode 168. The first current collector layer 164 may be disposed on a first surface 170 of the separator layer 162 and the second current collector layer 166 may be disposed on a second surface 172 of the separator layer 162 opposite the first surface 170. In certain aspects, the first current collector layer 164 may include nickel.

The separator layer 162 may include a body portion 174, a first tab 176, and a second tab 178. The first current collector layer 164 may include a primary portion 180 and a tab portion 182. The primary portion 180 of the first current collector layer 164 may occupy substantially an entire superficial surface area of a surface of the body portion 174 of the separator layer 162. In certain aspects, larger-surface-area current collector layers provide more uniform thickness and porosity across the entire reference electrode assembly 160 and greater contact and conductivity between the first current collector layer 164 and an adjacent electrode. Larger-surface-area current collector layers may therefore facilitate more consistent measurements than smaller-surface-area current collector layers when the reference electrode assembly 160 is used in a three-electrode electrochemical cell. The tab portion 182 may extend onto the first tab 176 of the separator layer 162. The second current collector layer 166 and the reference electrode 168 may be similar to the second current collector layer 116 and the reference electrode 118 of FIGS. 2A-2C.

Figure 4:
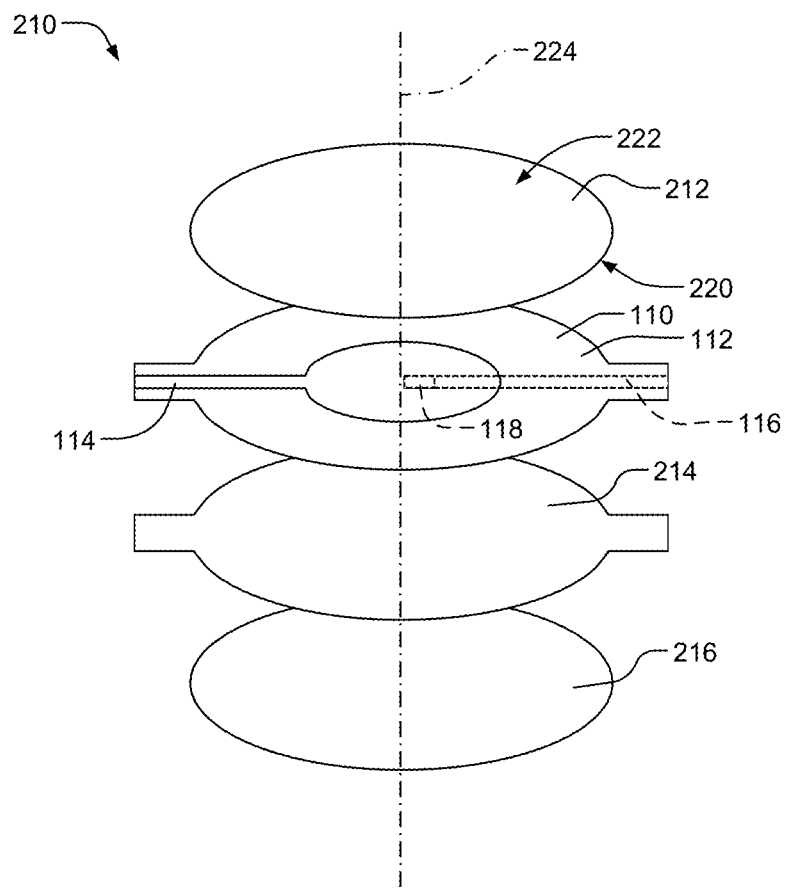
FIG. 4 is an exploded view of an electrode stack for a coin cell according to various aspects of the present disclosure, the electrode stack including the reference electrode assembly of FIGS. 2A-2B.

A reference electrode assembly in accordance with the present disclosure may have a variety of shapes and sizes. Moreover, the reference electrode assembly may be used in various configurations and types of electrochemical devices. Referring to FIG. 4, an electrode stack 210 for a coin cell according to various aspects of the present disclosure is provided. The electrode stack 210 may generally include a first electrode 212, the reference electrode assembly 110, a separator component 214, and a second electrode 216. In certain aspects, the first electrode 212 may be a negative electrode similar to the negative electrode 22 of FIG. 1 and the second electrode 216 may be a positive electrode similar to the positive electrode 24 of FIG. 1.

The reference electrode assembly 110 may be disposed between the first electrode 212 the second electrode 216, and more particularly, between the first electrode 212 and the separator component 214. The first current collector layer 114 of the reference electrode assembly 110 may be disposed toward the first electrode 212 and the second current collector layer 116, and the reference electrode 118 may be disposed toward the separator component 214.

The first electrode 212 may include a first or front side 220 and a second or back side 222. The back side 222 is configured to be in electrical communication with a current collector component (see, e.g., negative electrode current collector 278 of FIG. 6). The first current collector layer 114 may be in electrical communication (e.g., direct physical contact) with the front side 220 of the first electrode 212, as will be described in greater detail in conjunction with FIG. 6. The separator component 214 may be disposed between the reference electrode 118 and the second electrode 216.

The first electrode 212, reference electrode assembly 110, separator component 214, and second electrode 216 may have centers that are substantially aligned along a longitudinal axis 224. In certain aspects, the electrode stack 210 may be used in a three-electrode fixture (along with other components described above, such as an electrolyte), such as the fixture discussed in U.S. patent application Ser. No. 15/885,318 (Filing Date: Jan. 31, 2018; Title: "Three-Electrode Device For Performing Electrochemical Analysis On Lithium Ion Batteries"; Inventors: Kevin B. Rober, Brain J. Koch, and Robert S. Conell), herein incorporated by reference in its entirety. In certain other aspects, the electrode stack 210 may be used in an electrochemical device on a vehicle, for example.

Figure 5:
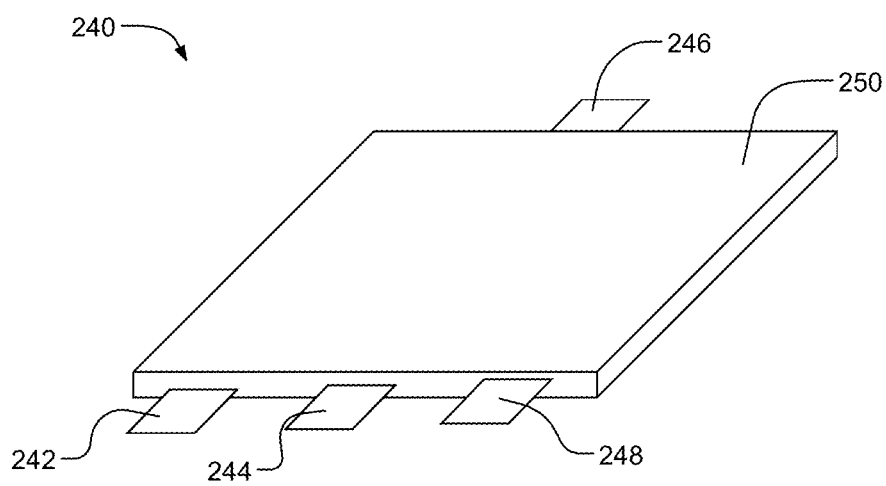
FIG. 5 is a perspective view of a pouch cell according to various aspects of the present disclosure.

With reference to FIG. 5, a three-electrode pouch cell 240 according to various aspects of the present disclosure is provided. The three-electrode pouch cell 240 includes an electrode stack. The electrode stack may generally include a negative electrode including a negative electrode tab 242, a reference electrode assembly including a first tab 244 and a second tab 246, a separator component (not shown), and a positive electrode including a positive electrode tab 248. The negative electrode, separator component, and positive electrode may be similar to the negative electrode 22, positive electrode 24, and porous separator 26 of FIG. 1. The reference electrode assembly may be similar to the reference electrode assembly 110 of FIGS. 2A-2C. The electrode stack may include other components described above, such as an electrolyte, and be disposed in an electrically-insulating housing 250.

Figure 6:
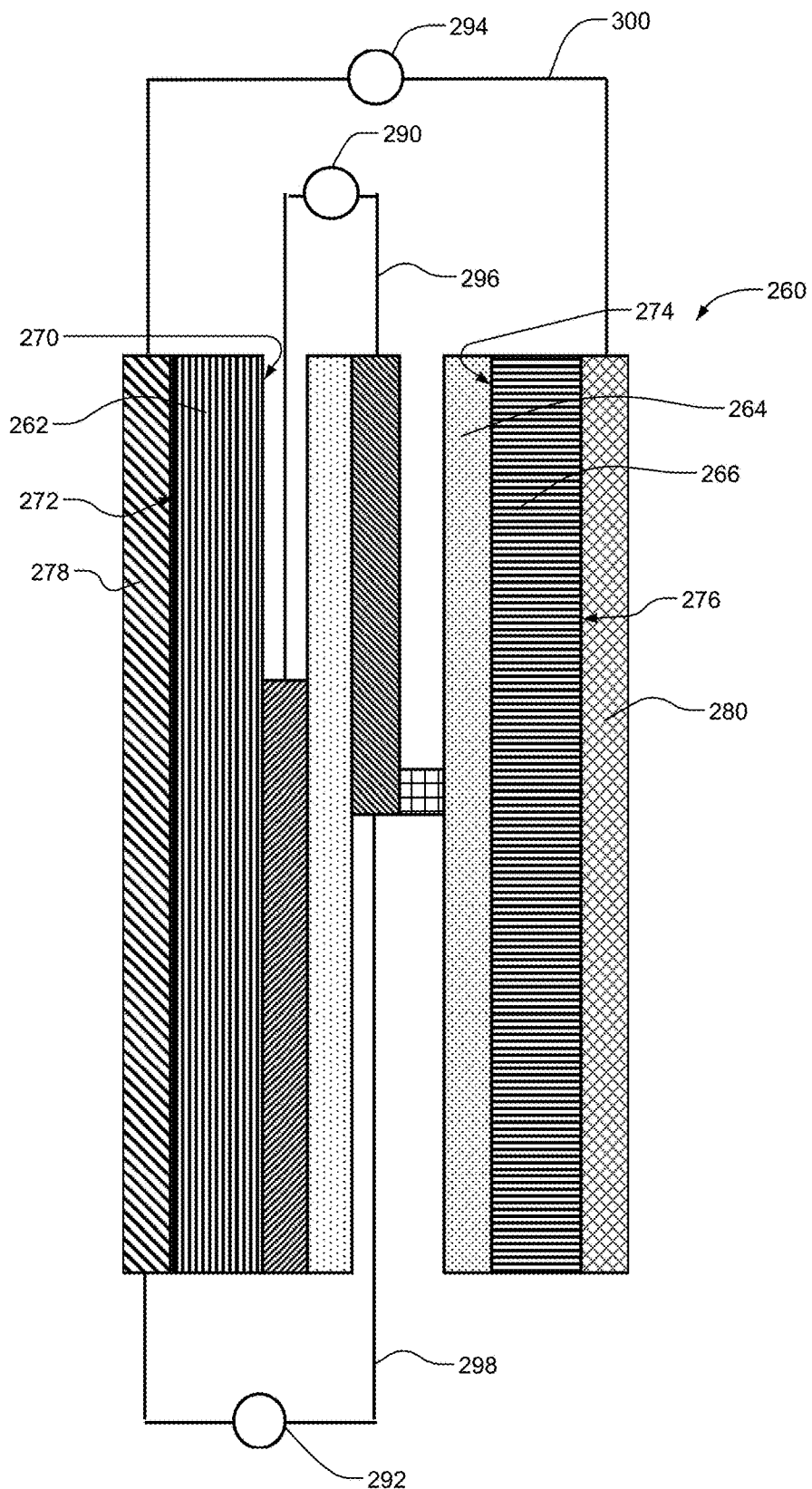
FIG. 6 is a schematic view of a three-electrode electrochemical cell according to various aspects of the present disclosure.

Referring to FIG. 6, a three-electrode electrochemical cell 260 according to various aspects of the present disclosure is provided. The cell 260 generally includes a first or negative electrode 262, the reference electrode assembly 110, a separator component 264, and a second or positive electrode 266. The negative electrode 262, positive electrode 266, and separator component 264 may be similar to the negative electrode 22, positive electrode 24, and porous separator 26 of FIG. 1. In various alternative aspects, positions of the negative and positive electrodes 262, 266 may be reversed.

The negative electrode 262 includes a first or front side 270 and a second or back side 272. The positive electrode 266 includes a first or front side 274 and a second or back side 276. The cell 260 further includes a negative electrode current collector 278 in electrical communication with the negative electrode 262. More particularly, the negative electrode current collector 278 may be in direct contact with the back side 272 of the negative electrode 262. The cell further includes a positive electrode current collector 280 in electrical communication with the positive electrode 266. More particularly, the positive electrode current collector 280 may be in direct contact with the back side 276 of the positive electrode 266.

The cell 260 may be electrically connected to a plurality of measurement devices, such as a first voltage meter 290, a second voltage meter 292, and a third voltage meter 294. The first voltage meter 290 may be electrically connected to the first current collector layer 114 and the second current collector layer 116 via a first external circuit 296. Accordingly, the first voltage meter 290 may be configured to detect a potential between the reference electrode 118 and the front side 270 of the negative electrode 262. The second voltage meter 292 may be electrically connected to the negative electrode current collector 278 and the second current collector layer 116 via a second external circuit 298. Accordingly, the second voltage meter 292 may be configured to detect a potential between the reference electrode 118 and the back side 272 of the negative electrode 262. The third voltage meter 294 may be electrically connected to the negative and positive electrode current collectors 278, 280 via a third external circuit 300 to detect a potential between the back side 272 of the negative electrode 262 and the back side 276 of the positive electrode 266.

Figure 7:
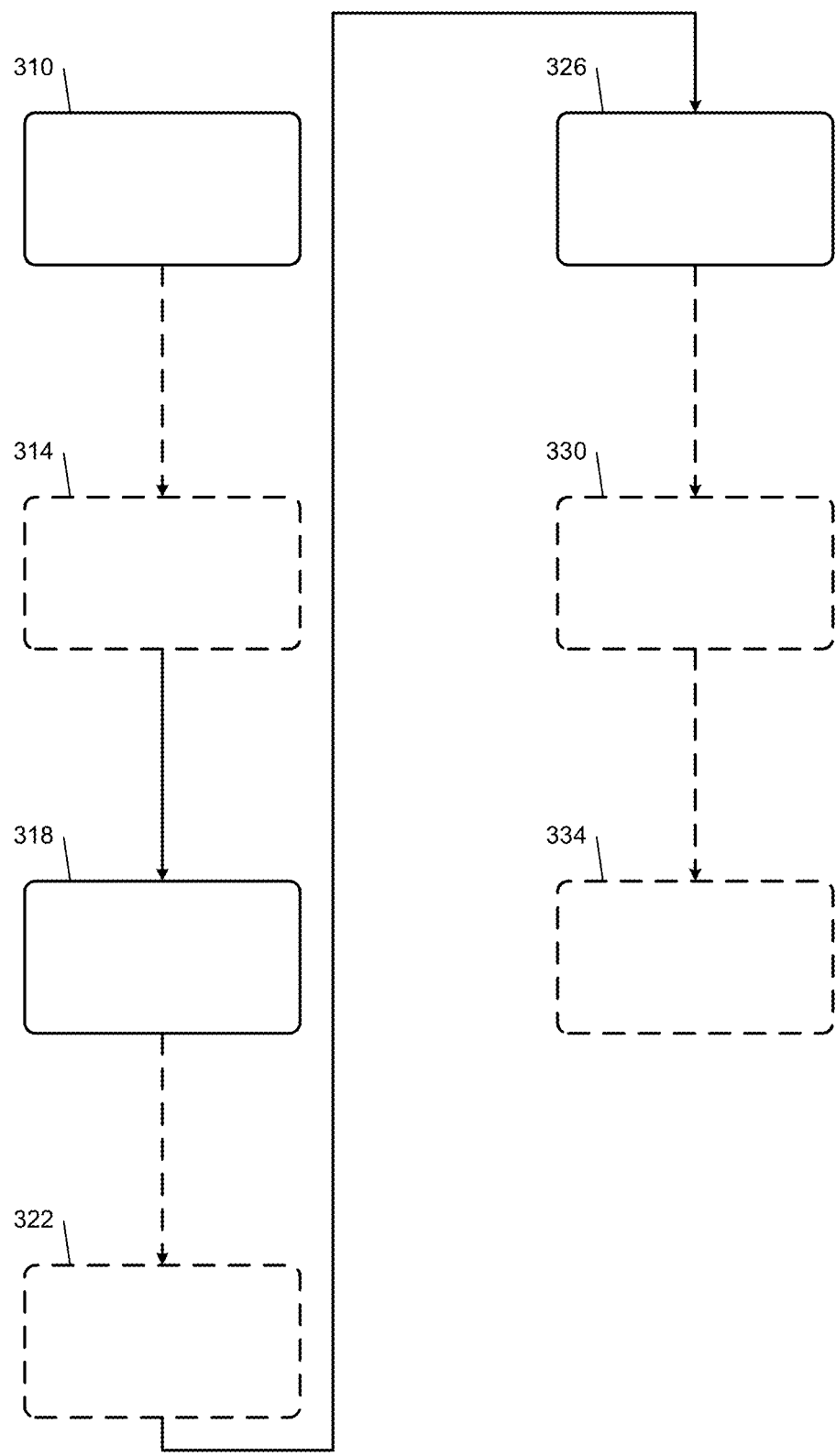
FIG. 7 is a flowchart depicting a method of manufacturing a reference electrode assembly according to various aspects of the present disclosure.

With reference to FIG. 7, a flowchart depicting a method of manufacturing a three-electrode cell, including manufacturing a reference electrode assembly, according to various aspects of the present disclosure is provided. The method generally includes providing a separator at 310, optionally applying a mask layer at 314, sputtering a current collector layer at 318, optionally removing the mask layer at 322, applying an electroactive layer to form a reference electrode assembly at 326, and optionally subdividing the reference electrode assembly at 330. The method may further include assembling a three-electrode cell including the reference electrode assembly at 334. Each step is described in greater detail below.

Providing a Separator

At 310, the method includes providing a separator. The separator may be similar to the separator layer 112 of FIGS. 2A-2C. In certain aspects, providing a separator at 310 may include applying a ceramic coating to a porous membrane, such as by roll coating.

Applying a Mask Layer

At 314, the method may optionally include applying a mask layer to the separator. The mask layer may at least partially define a region onto which a current collector layer will be applied. With reference to FIGS. 8A-8C, a method of applying a mask layer according to various aspects of the present disclosure is provided.

FIG. 8A depicts a separator layer 350 having a first surface 352 and a second surface 354 opposite the first surface 352. FIG. 8B depicts a mask layer 356. The mask layer 356 includes a perimeter 358 defining an open region 360. The mask layer 356 may generally be nonporous and have a melting point sufficiently high to withstand subsequent manufacturing steps, such as sputtering. In certain aspects, the mask layer 356 may include a metal (e.g., stainless steel, brass), a plastic (e.g., polytetrafluoroethylene (PTFE)), cellulose (e.g., paper, cardstock), or a water-soluble composition. A metal mask layer may be photo etched. A plastic mask layer may be a laser-cut, die-cut, or CNC-cut plastic film.

FIG. 8C depicts a masked separator 361 including the mask layer 356 and the separator layer 350. The mask layer 356 is applied to a first region 362 of the first surface 352 of the separator layer 350. The open region 360 of the mask layer 356 is aligned with a distinct second region 364 of the first surface 352 of the separator layer 350 and at least partially defines an area onto which a first current collector layer may be deposited. When the mask layer 356 is in a solid form, it may be applied by placing it on the separator layer 350. When the mask layer 356 is in a liquid form, it may be applied as a spray, by way of example. The method may include releasably coupling the mask layer 356 to the separator layer 350. The mask layer 356 may be releasably coupled to the separator layer 350 by gravity, magnets, clamps, or a temporary adhesive (e.g., silicone- or acrylate-based adhesives), by way of example.

During subsequent manufacturing steps, such as sputtering the current collector layer at step 318, the mask layer 356 may prevent deposition in the first region 362 of the separator layer 350. The mask layer 356 may also dissipate heat during subsequent manufacturing steps to reduce or prevent overheating of the separator layer 350. Accordingly, the mask layer 356 can facilitate protecting the separator layer 350 and maintaining an initial porosity of the separator layer 350 during subsequent manufacturing steps, such as sputtering.

The method may further include applying another mask layer to the second surface 354 of the separator layer 350 for deposition of a second current collector layer. In certain aspects, the mask layer may be applied to the second surface any time prior to sputtering the second current collector layer, such as immediately prior to sputtering the second current collector layer.

Sputtering a Current Collector Layer

Returning to FIG. 7, at 318, the method includes forming a subassembly by sputtering a current collector layer (e.g., a first current collector layer and a second current collector layer) onto a separator layer. Sputtering may include ion beam sputtering deposition (IBSD) or magnetron sputtering deposition. IBSD and magnetron sputtering deposition may deposit current collector layers on a separator layer without overheating the separator such that its porosity is reduced or eliminated. Therefore, the sputtering methods may be performed while maintaining the separator layer above its melting temperature. In certain aspects, the separator layer may be maintained at a temperature of less than or equal to about 30° C., optionally less than or equal to about 25° C., or optionally less than or equal to about 20° C. Current collector layers formed by the sputtering processes according to the principles of the present disclosure may have a substantially uniform thickness, a low surface roughness, and good adhesion to the separator layer, and be relatively thin, as described above. A porosity of the separator layer after sputtering may remain substantially unchanged compared to an initial porosity. In certain aspects, after sputtering, the porosity of the separator layer may be greater than or equal to about 40%, optionally greater than or equal to about 50%, greater than or equal to about 60%, or greater than or equal to about 70%.

Step 318 may include sputtering a first current collector layer and a second current collector layer. The method may include sputtering the first current collector layer before the second current collector layer or sputtering the second current collector layer before sputtering the first current collector layer. The sputtering processes can be performed to create a single subassembly, such as for lab use, or a plurality of subassemblies via batch or continuous processing (e.g., roll-to-roll manufacturing).

(A) Ion Beam Sputtering Deposition

In various aspects, IBDS may be performed with high precision and repeatability. It is therefore particularly suitable for forming current collector layers having small thicknesses and/or high aspect ratios. Referring to FIG. 9, a system 410 for performing IBSD to form a subassembly including a separator layer and a current collector layer according to various aspects of the present disclosure is provided. The system generally includes a rotatable substrate holder 412, a target 414, and an ion gun 416. The substrate holder 412 includes a surface 418 onto which one or more separator layers 420 (i.e., substrates) may be disposed. The target 414 includes the electrically-conductive component to be deposited on the separator layers 420 to form an electrically-conductive layer. The substrate holder 412 may be rotatable about a substrate holder axis 422. In certain aspects, the target may be rotatable about a target axis 424.

Several parameters in IBSD may be independently controlled to achieve a current collector layer having a desired microstructure, thickness, porosity, and/or surface roughness. In certain aspects, a target sputtering rate may be greater than or equal to about 1 nm/min to less than or equal to about 200 nm/min, optionally greater than or equal to about 20 nm/min to less than or equal to about 150 nm/min, or optionally greater than or equal to about 40 nm/min to less than or equal to about 100 nm/min, or optionally about 60 nm/min. In certain aspects, an ion energy may be greater than or equal to about 100 eV to less than or equal to about 1,000 eV, optionally greater than or equal to about 350 eV to less than or equal to about 800 eV, optionally greater than or equal to about 600 eV to less than or equal to about 700 eV, or optionally about 650 eV. In certain aspects, an ion current density may be greater than or equal to about 0.1 mA/cm$^2$ to less than or equal to about 10 mA/cm$^2$, optionally greater than or equal to about 0.5 mA/cm$^2$ to less than or equal to about 5, optionally greater than or equal to about 0.8 mA/cm$^2$ to less than or equal to about 1.2, or optionally about 1 mA/cm$^2$. In certain aspects, a deposition pressure may be greater than or equal to about 2 torr to less than or equal to about 10 torr, optionally greater than or equal to about 4 torr to less than or equal to about 10 torr, or optionally greater than or equal to about 5 to less than or equal to about 10 torr. In certain aspects, an angle of incidence 430 may be greater than or equal to about 20° to less than or equal to about 60°. For example, the angle of incidence 430 may be greater than or equal to about 20° to less than or equal to about 30°, greater than or equal to about 30° to less than or equal to about 40°, greater than or equal to about 40° to less than or equal to about 50°, or greater than or equal to about 50° to less than or equal to about 60°.

During sputtering, the ion gun 416 uses a high-energy electrical field to accelerate a beam of ions that is focused on the target 414. The acceleration imparts a very high kinetic energy (e.g., on the order of 10-1,000 eV). The ion beam from the ion gun 416 may travel between the ion gun 416 and the target 414 in an ion beam region 432. Upon impact of ions from the ion gun 416 with the target 414, electrically-conductive particles from the target 414 travel from the target 414 to the separator layers 420 in a deposition region 434. In various aspects, the system 410 may include an additional ion beam source (not shown) to be used in a post-deposition step. The additional ion beam source could facilitate increasing porosity and/or surface modification.

(B) Magnetron Sputtering Deposition

With reference to FIG. 10, a system 450 for performing magnetron sputtering deposition according to various aspects of the present disclosure is provided. The system 450 may generally include an anode 452, which also serves as a substrate holder and a magnetron cathode 454. The magnetron cathode 454 is electrically connected to a DC power source 456. The magnetron cathode 454 includes a magnetic array 458. A target 460 is disposed on the magnetron cathode 454. One or more separator layers 470 (i.e., substrates) are disposed on a surface 472 of the anode 452. The system 450 may further include a sputter gas inlet 474 and a sputter gas outlet 476. A cooling fluid 478, such as water, may be circulated through the anode 452.

Various parameters may be controlled to achieve desired microstructure, thickness, porosity, and/or surface roughness. In certain aspects, a sputtering gas volumetric flow rate may be greater than or equal to about 20 standard cubic centimeters per minute (sccm) to less than or equal to about 300 sccm, optionally greater than or equal to about 50 sccm to less than or equal to about 200 sccm, optionally greater than or equal to about 80 sccm to less than or equal to about 100 sccm, or optionally about 90 sccm. In certain aspects, a voltage may be greater than or equal to about 30 V to less than or equal to about 300 V, optionally greater than or equal to about 60 V to less than or equal to about 200 V, optionally greater than or equal to about 90 V to less than or equal to about 110 V, or optionally about 100 V. In certain aspects, a deposition pressure may be greater than or equal to about 3 mTorr to less than or equal to about 32 mTorr, optionally greater than or equal to about 8 mTorr to less than or equal to about 24 mTorr, optionally greater than or equal to about 12 mTorr to less than or equal to about 16 mTorr, or optionally about 14 mTorr. In certain aspects, the sputtering gas may include argon.

The target 460 is formed from an electrically-conductive material. During sputtering, particles from the target 460 travel toward the separator layer 470 and are deposited on the separator layer 470 to form an electrically-conductive layer 480. During sputtering, the cooling fluid 478 may maintain the anode 452 at a temperature of less than or equal to about 25° C., by way of example.

Removing the Mask Layer

Returning to FIG. 7, at 322, the method may include removing a mask layer if a mask layer was applied at step 314. The mask layer may be removed by removing clamps or magnets, if present. Additionally or alternatively, the mask layer may be removed by peeling away a temporary adhesive. Additionally or alternatively, the mask layer may be removed by applying a solvent, such as an aqueous solvent.

Applying an Electroactive Layer

At 326, the method may further include applying an electroactive layer or a reference electrode. The reference electrode may be applied forming a slurry including an electroactive material particle, a binder, and a solvent and spraying or screen printing the slurry onto the separator layer, by way of example. In certain aspects, step 326 may alternatively be performed prior to step 318 so that the reference electrode is disposed directly on a surface of the separator layer and the current collector layer is formed on the reference electrode. Accordingly, the reference electrode would be disposed between the separator layer and the current collector layer.

Subdividing the Reference Electrode Assembly

At 330, the method may optionally include subdividing the reference electrode assembly to form a plurality of reference electrode assemblies. Step 330 may be included, for example, when the reference electrode assembly is manufactured in a large-scale process, such as roll-to-roll processing. In certain aspects, subdividing may include die-cutting, by way of non-limiting example.

Assembling a Three Electrode Electrochemical Cell

In various aspects, at 334, the method may optionally include assembling a three-electrode cell, such as a coin cell including the electrode stack 210 of FIG. 4, the three-electrode pouch cell 240 of FIG. 5, or the three-electrode electrochemical cell 260 of FIG. 6, by way of example. The cell may be assembled according to methods known in the art.

EXAMPLE 1

With reference to FIG. 11, a graph depicting negative electrode potential as a function of time according to various aspects of the present disclosure is provided. An x-axis 510 represents time in seconds. A y-axis 512 represents front-side negative electrode potential in volts (V). A lithium plating threshold is shown at 514, at approximately 0 V. The graph further includes a plurality of curves 516 representing cells operated at different cell currents. A first curve 516-1 is run at the highest cell current, fastest charge, and highest likelihood of plating lithium. A second curve 516-2 is run at the lower cell current, slowest charge, and smallest likelihood of plating lithium.

During operation of an electrochemical cell, lithium plating may be reduced or avoided when the voltage is above the lithium plating threshold 514. A cell current may be selected to ensure that the front-side negative electrode potential remains about 0 V. In on-vehicle use, for example, closed-loop control may be used to reduce cell current as front-side negative electrode potential approaches 0V. Current can be reduced such that a desired front-side negative electrode potential is maintained at a predetermined value above 0 V.

EXAMPLE 2

An electrochemical cell includes a graphite-based negative electrode and a reference electrode assembly according to various aspects of the present disclosure. Referring to FIG. 12, a graph related to optimizing lithium ion fast charge is provided. An x-axis 550 represents time in seconds. A first y-axis 552 represents battery back equivalent current in V, a second y-axis 554 represents front-side potential in V. A first curve 556 depicts current, a second curve 558 depicts anode potential, and a third curve 560 depicts cell potential. A lithium plating threshold is shown at 562. A first region 570 depicts the effects of holding current substantially constant. A second region 572 depicts the effects of holding anode potential substantially constant. A third region 574 depicts the effects of holding cell potential substantially constant.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of manufacturing a component for a reference electrode assembly, the method comprising:
   providing a separator layer having a first surface and a second surface opposite the first surface, the separator layer being electrically insulating and ionically conductive; and
   sputtering a first current collector layer directly to the first surface, the sputtering including magnetron sputtering deposition or ion beam sputtering deposition, wherein a porosity of the separator layer is substantially unchanged by the sputtering the first current collector layer, and the porosity after the sputtering is greater than or equal to about 50%.

2. The method of claim 1, further comprising:
   sputtering a second current collector layer to the second surface, the sputtering including magnetron sputtering deposition or ion beam sputtering deposition.

3. The method of claim 2, wherein:
   the first current collector layer comprises nickel and defines a first thickness of greater than or equal to about 200 nm to less than or equal to about 300 nm; and
   the second current collector layer comprises gold and defines a second thickness of greater than or equal to about 25 nm to less than or equal to about 100 nm.

4. The method of claim 2, further comprising applying an electroactive layer in contact with the second current collector layer.

5. The method of claim 2, wherein the first current collector layer comprises nickel.

6. The method of claim 2, wherein the first current collector layer defines a first thickness of greater than or equal to about 200 nm to less than or equal to about 300 nm.

7. The method of claim 6, wherein a first variation in the second thickness is less than or equal to about 0.5 µm.

8. The method of claim 2, wherein the second current collector layer comprises gold.

9. The method of claim 2, wherein the second current collector layer defines a second thickness of greater than or equal to about 25 nm to less than or equal to about 100 nm.

10. The method of claim 9, wherein a second variation in the third thickness is less than or equal to about 0.5 µm.

11. The method of claim 1, further comprising:
    prior to the sputtering, applying a mask layer to a first region of the first surface; and
    after the sputtering, removing the mask layer from the first surface such that the first current collector layer is disposed in a second region of the first surface distinct from the first region.

12. The method of claim 11, wherein the mask layer comprises metal, a plastic, cellulose, or a water-soluble composition.

13. The method of claim 11, further comprising
    coupling the mask layer to the separator layer by a magnet, a clamp, a temporary adhesive, or any combination thereof.

14. The method of claim 1, wherein the sputtering comprises the magnetron sputtering deposition.

15. The method of claim 14, wherein the magnetron sputtering deposition further includes cooling the separator layer concurrently with the sputtering.

16. The method of claim 14, wherein:
    a volumetric flow rate of a sputtering gas is greater than or equal to about 20 standard cubic centimeters per minute (sccm) to less than or equal to about 300 sccm;
    a voltage is greater than or equal to about 30 V to less than or equal to about 300 V; and
    a deposition pressure is greater than or equal to about 3 millitorr (mTorr) to less than or equal to about 32 mTorr.

17. The method of claim 1, wherein the sputtering includes the ion beam sputtering deposition.

18. The method of claim 17, wherein:
    a sputtering rate is greater than or equal to about 1 nm/min to less than or equal to about 200 nm/min;
    an ion energy is greater than or equal to about 100 eV to less than or equal to about 100 eV;
    an ion current density is greater than or equal to about 0.1 mA/cm$^2$ to less than or equal to about 10 mA/cm$^2$; and
    an angle of incidence is greater than or equal to about 20° to less than or equal to about 60°.

19. The method of claim 1, wherein the separator layer is maintained at a temperature of less than or equal to about 25° C. during the sputtering.

20. The method of claim 1, where the porosity is greater than or equal to about 70% to less than or equal to about 80%.

* * * * *